(12) United States Patent
Seo et al.

(10) Patent No.: US 11,682,460 B2
(45) Date of Patent: Jun. 20, 2023

(54) NON-VOLATILE MEMORY DEVICE, STORAGE DEVICE AND PROGRAM METHOD THEREOF

(71) Applicant: Samsung Electronics Co., Ltd., Suwon-si (KR)

(72) Inventors: Jun-ho Seo, Hwaseong-si (KR); Sangwon Hwang, Suwon-si (KR); Suk-Eun Kang, Hwaseong-si (KR); Haneol Jang, Hwaseong-si (KR); Youngwook Jeong, Seoul (KR); Wanha Hwang, Taean-gun (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/714,552

(22) Filed: Apr. 6, 2022

(65) Prior Publication Data
US 2022/0230687 A1 Jul. 21, 2022

Related U.S. Application Data

(63) Continuation of application No. 17/098,590, filed on Nov. 16, 2020, now Pat. No. 11,322,208.

(30) Foreign Application Priority Data

Jan. 21, 2020 (KR) .......................... 10-2020-0007972

(51) Int. Cl.
*G11C 16/16* (2006.01)
*G11C 16/26* (2006.01)
*G11C 16/34* (2006.01)
*G11C 16/24* (2006.01)
*G11C 16/08* (2006.01)

(52) U.S. Cl.
CPC .............. *G11C 16/16* (2013.01); *G11C 16/08* (2013.01); *G11C 16/24* (2013.01); *G11C 16/26* (2013.01); *G11C 16/3445* (2013.01)

(58) Field of Classification Search
CPC ......... G11C 16/16; G11C 16/08; G11C 16/24; G11C 16/26; G11C 16/3445; G11C 2029/0411; G11C 7/1006; G11C 11/5628; G11C 16/10; G11C 16/0483; G11C 16/14; G11C 16/3427
See application file for complete search history.

(56) References Cited

U.S. PATENT DOCUMENTS 7,679,133 B2 3/2010 Son et al.
7,729,166 B2 6/2010 Kim et al.
(Continued)

FOREIGN PATENT DOCUMENTS

KR 10-2016-0042623 A 4/2016

*Primary Examiner* — Xiaochun L Chen
(74) *Attorney, Agent, or Firm* — Harness, Dickey & Pierce, P.L.C.

(57) ABSTRACT

A program method of a nonvolatile memory device including receiving a write address and write data, generating a seed corresponding to the write address, generating a random sequence by using the seed, randomizing the write data by using the random sequence, and programming the randomized write data to a memory area corresponding to the write address may be provided. The seed may provide state shaping variable depending on a location of a word line, at which the received write data is to be programmed.

20 Claims, 18 Drawing Sheets

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 8,856,428 B2 | 10/2014 | Lee et al. |
| 9,268,531 B1 | 2/2016 | Woo et al. |
| 9,405,622 B2 | 8/2016 | Varanasi |
| 9,575,683 B2 | 2/2017 | Achtenberg et al. |
| 9,583,207 B2 | 2/2017 | Khurana et al. |
| 9,734,898 B2 | 8/2017 | Seol et al. |
| 10,146,451 B2 | 12/2018 | Liu |
| 2011/0233648 A1 | 9/2011 | Seol et al. |
| 2012/0272017 A1 | 10/2012 | Lee et al. |
| 2019/0096485 A1* | 3/2019 | Jung .................. G11C 7/02 |

\* cited by examiner

FIG. 9

Seed Table

| WL | Seed | State shape (%) | | | | | |
|---|---|---|---|---|---|---|---|
| | | E | P1~P3 | P4~P12 | P13 | P14 | P15 |
| WL1 | SED1 | 50% | 50% | 110% | 90% | 95% | 95% |
| WL2 | SED2 | 52% | 73% | 110% | 95% | 95% | 95% |
| WL3 | SED3 | 53% | 73% | 105% | 98% | 98% | 95% |
| WL4 | SED4 | 53% | 73% | 105% | 98% | 98% | 96% |
| ⋮ | ⋮ | ⋮ | ⋮ | ⋮ | ⋮ | ⋮ | ⋮ |
| WL44 | SED44 | 95% | 95% | 110% | 70% | 60% | 50% |
| WL45 | SED45 | 95% | 95% | 110% | 71% | 61% | 51% |
| WL46 | SED46 | 96% | 96% | 110% | 70% | 60% | 51% |
| WL47 | SED47 | 96% | 96% | 105% | 69% | 62% | 50% |
| ⋮ | ⋮ | ⋮ | ⋮ | ⋮ | ⋮ | ⋮ | ⋮ |
| WL89 | SED89 | 99% | 99% | 105% | 98% | 98% | 98% |
| WL90 | SED90 | 99% | 99% | 105% | 98% | 98% | 98% |
| WL91 | SED91 | 99% | 99% | 105% | 98% | 98% | 98% |
| WL92 | SED92 | 99% | 99% | 105% | 98% | 98% | 98% |

FIG. 10

Seed Table

| WL | Seed | State shape (%) | | | | | |
|---|---|---|---|---|---|---|---|
| | | E | P1~P3 | P4~P12 | P13 | P14 | P15 |
| WL1~WL9 | SED_a | 50% | 70% | 110% | 90% | 95% | 95% |
| WL10~WL78 | SED_b | 95% | 96% | 110% | 71% | 61% | 51% |
| WL79~WL92 | SED_c | 99% | 99% | 105% | 98% | 98% | 98% |

FIG. 12A

Seed Table

| BLK | Seed | State shape (%) | | | | | |
|---|---|---|---|---|---|---|---|
| | | E | P1~P3 | P4~P12 | P13 | P14 | P15 |
| 0~2999 | SED_i | 50% | 70% | 110% | 90% | 95% | 95% |
| 3000~3399 | SED_j | 95% | 96% | 110% | 71% | 61% | 51% |
| 3400~3799 | SED_k | 99% | 99% | 105% | 98% | 98% | 98% |
| 3800~6799 | SED_l | 95% | 97% | 105% | 97% | 95% | 95% |

FIG. 12B

Seed Table

| Plane | Seed | State shape (%) | | | | | |
|---|---|---|---|---|---|---|---|
| | | E | P1~P3 | P4~P12 | P13 | P14 | P15 |
| 1~5 | SED_i | 50% | 70% | 110% | 90% | 95% | 95% |
| 6~10 | SED_j | 95% | 96% | 110% | 71% | 61% | 51% |
| 11~15 | SED_k | 99% | 99% | 105% | 98% | 98% | 98% |
| 16~20 | SED_l | 95% | 97% | 105% | 97% | 95% | 95% |

NON-VOLATILE MEMORY DEVICE, STORAGE DEVICE AND PROGRAM METHOD THEREOF

CROSS-REFERENCE TO RELATED APPLICATIONS

This application is a continuation of U.S. application Ser. No. 17/098,590, filed on Nov. 16, 2020, which claims priority under 35 U.S.C. § 119 to Korean Patent Application No. 10-2020-0007972 filed on Jan. 21, 2020, in the Korean Intellectual Property Office, the disclosure of each of which is incorporated by reference herein in its entirety.

BACKGROUND

Some example embodiments of the inventive concepts disclosed herein relate to semiconductor memory devices, and more particularly, relate to nonvolatile memory devices, storage devices, and/or program methods thereof.

A flash memory device is being widely used as a voice and image data storage medium of information devices such as a computer, a smartphone, a personal digital assistant (PDA), a digital camera, a camcorder, a voice recorder, an MP3 player, and a handheld PC. The flash memory device is becoming increasingly popular as a storage device. Nowadays, a semiconductor memory device with a three-dimensional array structure is being used to improve the degree of integration of the flash memory device. Cell strings of the flash memory device having the three-dimensional array structure are stacked along a direction perpendicular to a substrate. That is, memory cells are provided on the substrate along rows and columns and are stacked in the direction perpendicular to the substrate to form the three-dimensional structure.

The degree of integration of the storage device using a flash memory and a volume thereof continues to increase as semiconductor manufacturing technologies develop. The high degree of integration of the storage device makes it possible to reduce costs for manufacturing the storage device. However, in the case where the storage device is scaled down due to the high degree of integration thereof, various issues newly occur. Such issues cause a damage of data stored in the storage device, thereby deteriorating the reliability of the storage device. There is a continuous demand on methods and/or devices capable of improving reliability of the storage device.

SUMMARY

Some example embodiments of the inventive concepts provide nonvolatile memory devices and/or program methods thereof capable of solving a read disturbance due to the high integration or the reduction of reliability due to charge leakage.

According to an example embodiment, a program method of a nonvolatile memory device includes receiving a write address and write data, generating a seed corresponding to the write address, generating a random sequence by using the seed, randomizing the write data by using the random sequence, and programming the randomized write data to a memory area corresponding to the write address. The seed provides state shaping variable depending on a location of a word line.

According to an example embodiment, a storage device includes a storage controller configured to receive write data and a write address from a host and perform randomization on the write data to perform state shaping on memory cells selected depending on the write address, and a nonvolatile memory device that programs the randomized write data to a memory area corresponding to the write address under control of the storage controller. The storage controller is configured to use a seed for the state shaping, and the seed is variable depending on a location of a word line.

According to an example embodiment, a nonvolatile memory device includes a cell array that includes a plurality of memory cells having a plurality of program states, an on-chip randomizer configured to randomize write data from an outside, a page buffer configured to program the randomized write data provided from the on-chip randomizer to the cell array, and a control logic circuit configured to select memory cells from the plurality of memory cells of the cell array in response to a command and an address provided from the outside and control the page buffer and the on-chip randomizer such that the randomized write data are programmed to the selected memory cells. The on-chip randomizer is configured to perform state shaping on the write data depending on a location of a word line.

BRIEF DESCRIPTION OF THE FIGURES

The above and other objects and features of the inventive concepts will become apparent by describing in detail some example embodiments thereof with reference to the accompanying drawings.

FIG. 9 is a diagram illustrating a seed table according to an example embodiment of the inventive concepts.

FIG. 10 is a diagram illustrating a seed table according to another example embodiment of the inventive concepts.

FIGS. 12A and 12B are diagrams illustrating seed tables according to another example embodiment of the inventive concepts.

DETAILED DESCRIPTION

Figure 1:
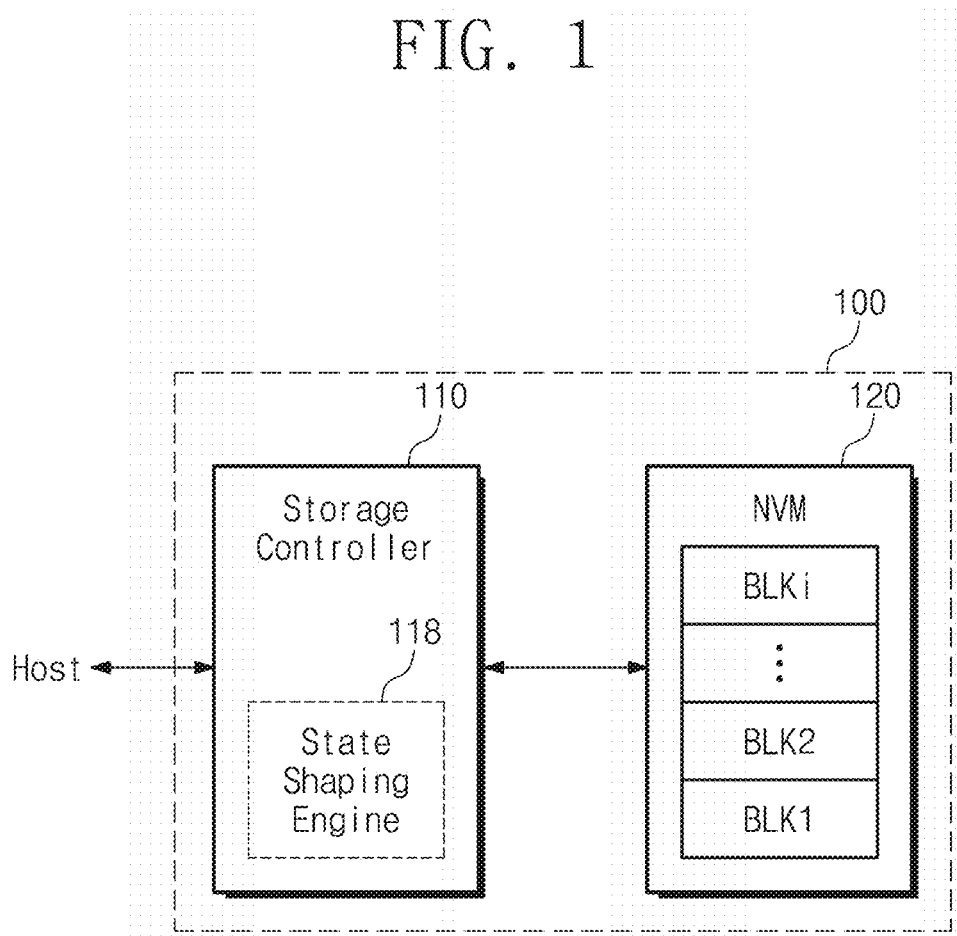
FIG. 1 is a block diagram illustrating a storage device according to an example embodiment of the inventive concepts.

It should be understood that both the foregoing general description and the following detailed description are provided as examples, and it should be regarded as an additional description is provided. Reference numerals will be represented in detail in some example embodiments of the inventive concepts, examples of which are illustrated in the accompanying drawings. Wherever possible, the same reference numerals are used in the drawings and the description to refer to the same or similar parts.

While the term "same," "identical" or "equal" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Below, a nonvolatile memory device may be used as an example for describing features and functions of the inventive concepts. However, one skilled in the art may easily understand other merits and performance of the inventive concepts depending on the content disclosed here. In addition, the term "state shaping" used in the inventive concepts means an operation of encoding a pattern of data stored in the nonvolatile memory device. That is, the "state shaping" means an encoding operation for adjusting a threshold voltage distribution for each area, which is formed as write data are programmed in the nonvolatile memory device, in units of a state. For example, the "state shaping" may include a randomizing operation that is applied to write data for the purpose of forming a threshold voltage distribution for each area.

The inventive concepts may also be implemented or applied through any other example embodiments. In addition, the detailed description may be changed or modified depending on view points and applications without departing from the claims, the scope and spirit, and any other purposes of the inventive concepts.

FIG. 1 is a block diagram illustrating a storage device according to an example embodiment of the inventive concepts. Referring to FIG. 1, a storage device 100 may include a storage controller 110 and a nonvolatile memory device 120. In an example embodiment, each of the storage controller 110 and the nonvolatile memory device 120 may be implemented with one chip, one package, or one module. In some example embodiments, the storage controller 110 and the nonvolatile memory device 120 may be implemented with one chip, one package, or one module so as to constitute a memory system such as a memory card, a memory stick, or a solid state drive (SSD).

The storage controller 110 may be configured to control the nonvolatile memory device 120. For example, in response to a request of a host, the storage controller 110 may write data to the nonvolatile memory device 120 or may read data stored in the nonvolatile memory device 120. To access the nonvolatile memory device 120, the storage controller 110 may provide a command, an address, data, and a control signal to the nonvolatile memory device 120.

For example, the storage controller 110 may include a state shaping engine 118 according to an example embodiment of the inventive concepts. The state shaping engine 118 may encode a pattern of write data capable of reducing reliability of the nonvolatile memory device 120 to a stable pattern. In addition, the state shaping engine 118 may decode a pattern of read data to recover an original pattern.

In a program operation, write data received from the host are encoded by the state shaping engine 118. For example, the state shaping engine 118 may perform encoding for providing a distribution differentiated for each area of the nonvolatile memory device 120. For example, the state shaping engine 118 may encode a pattern of write data to a data pattern having an optimum distribution on a word line basis, based on a weak or vulnerable characteristic of each of word lines of the nonvolatile memory device 120. Here, it may be well understood that a unit by which a write data pattern is shaped is not limited to a word line. In addition, the encoding may include a randomizing operation of randomly arranging logical values of write data. The data encoded by the state shaping engine 118 may be programmed to the nonvolatile memory device 120.

Under control of the storage controller 110, the nonvolatile memory device 120 may store data received from the storage controller 110 or may transmit data stored therein to the storage controller 110. The nonvolatile memory device 120 may include a plurality of memory blocks BLK1 to BLKi. Each of the plurality of memory blocks BLK1 to BLKi has a three-dimensional memory structure in which word line layers are stacked in a direction perpendicular to a substrate. Each of the plurality of memory blocks BLK1 to BLKi may be managed by the storage controller 110 by using information for wear leveling such as an "erase count EC".

As described above, according to an example embodiment of the inventive concepts, the storage device 100 may encode a pattern of write data capable of reducing the reliability of the nonvolatile memory device 120. To this end, the storage controller 110 may include the state shaping engine 118 for encoding a pattern of write data to an optimum distribution pattern on a word line basis. An operation of the state shaping engine 118 will be more fully described with reference to accompanying drawings. According to an example embodiment of the inventive concepts, state shaping for providing optimum reliability depending on differences between reliability characteristics of word lines, which occur in the three-dimensional nonvolatile memory device 120, is possible.

Figure 2:
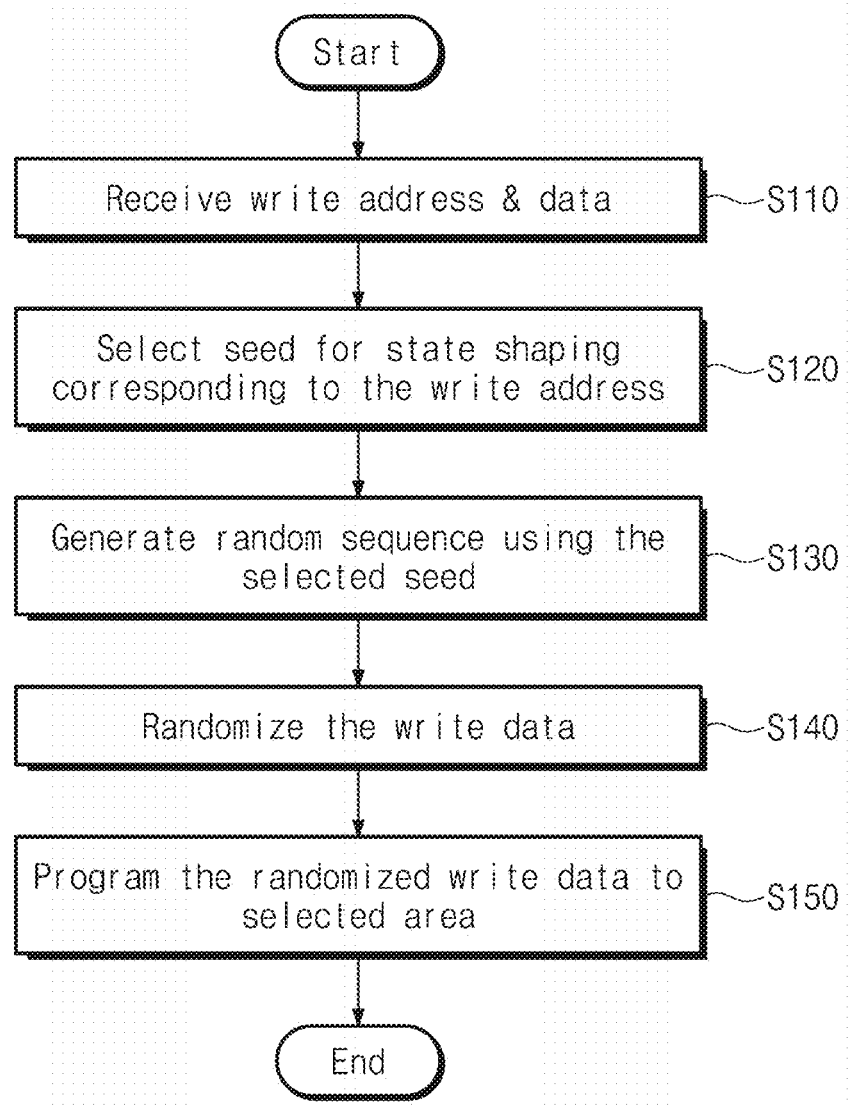
FIG. 2 is a flow chart illustrating a method of shaping a state for each area, which is performed by a state shaping engine of FIG. 1.

FIG. 2 is a flow chart illustrating a method of shaping a state for each area, which is performed by the state shaping engine 118 of FIG. 1. Referring to FIG. 2, the state shaping engine 118 (refer to FIG. 1) may perform a randomization operation for performing state shaping on data to be programmed on an area basis (e.g., a word line basis). In an example embodiment, word lines may be classified into, for example, three areas (being interchangeable with word line portions, word line zones, word line sections, word line stages, etc.) such as a lower area adjacent to a substrate, an upper area adjacent to a bit line (or a string selection line), and a middle area between the lower area and the upper area.

In operation S110, the storage controller 110 receives a write request from a host or the outside. The write request may include a command, write data, an address, etc. The received write request may be provided to the state shaping engine 118.

In operation S120, the state shaping engine 118 generates or selects a seed for state shaping with reference to a write address ADDR. The state shaping engine 118 may select a seed corresponding to a location of a word line, at which the received data is to be programmed, from a seed table. For example, in the case where a row address of the received write address ADDR corresponds to a word line belonging to the lower area, the state shaping engine 118 may select a seed mapped onto the selected word line. Memory cells connected with a word line belonging to the lower area close to the substrate may have a characteristic weak or vulnerable to the read disturbance. In the case of programming data based on the seed mapped onto the word line of the lower area, the number of memory cells included in an erase state "E" may decrease. The reduction of characteristic due to the read disturbance may decrease as the number of memory cells of the erase state "E" decreases.

Further, in the case where the row address of the received write address ADDR corresponds to a word line belonging to the middle area, the state shaping engine 118 may select a seed that is different from that of the lower area. A charge leakage characteristic appears at memory cells belonging to the middle area between a substrate and a bit line. In the case of programming memory cells connected with a word line of the middle area, the reduction of reliability due to the charge leakage may decrease by reducing the number of memory cells to be programmed to upper program states (e.g., program states P14 and P15 in a quadruple level cell (QLC).

In operation S130, the state shaping engine 118 generates a random sequence by using the selected seed. The state shaping engine 118 may include, for example, a random sequence generator for generating a random sequence RS by using the selected seed as a source.

In operation S140, the generated random sequence RS and the write data are processed, that is, a randomization operation is performed. For example, for randomization, an XOR operation may be performed on respective bits of the write data and respective bits of the random sequence RS.

In operation S150, the randomized write data may be programmed to a memory area selected by the address ADDR.

An example embodiment of the inventive concepts, in which state shaping is differently applied depending on a location of a word line targeted for a program operation, is described through the above procedure. According to some program methods of the inventive concepts, in the case where data are programmed to memory cells of word lines belonging to the lower area (or close to the substrate), a seed is used (or selected) in such a way that the number of memory cells included in the erase state "E" decreases. Accordingly, the reduction of characteristic due to the read disturbance may decrease as the number of memory cells of the erase state "E" decreases. Further, in the case of programming memory cells connected with word lines of the middle area, the reduction of reliability due to the charge leakage may decrease by reducing the number of memory cells to be programmed to upper program states (e.g., P14 and P15).

Figure 3:
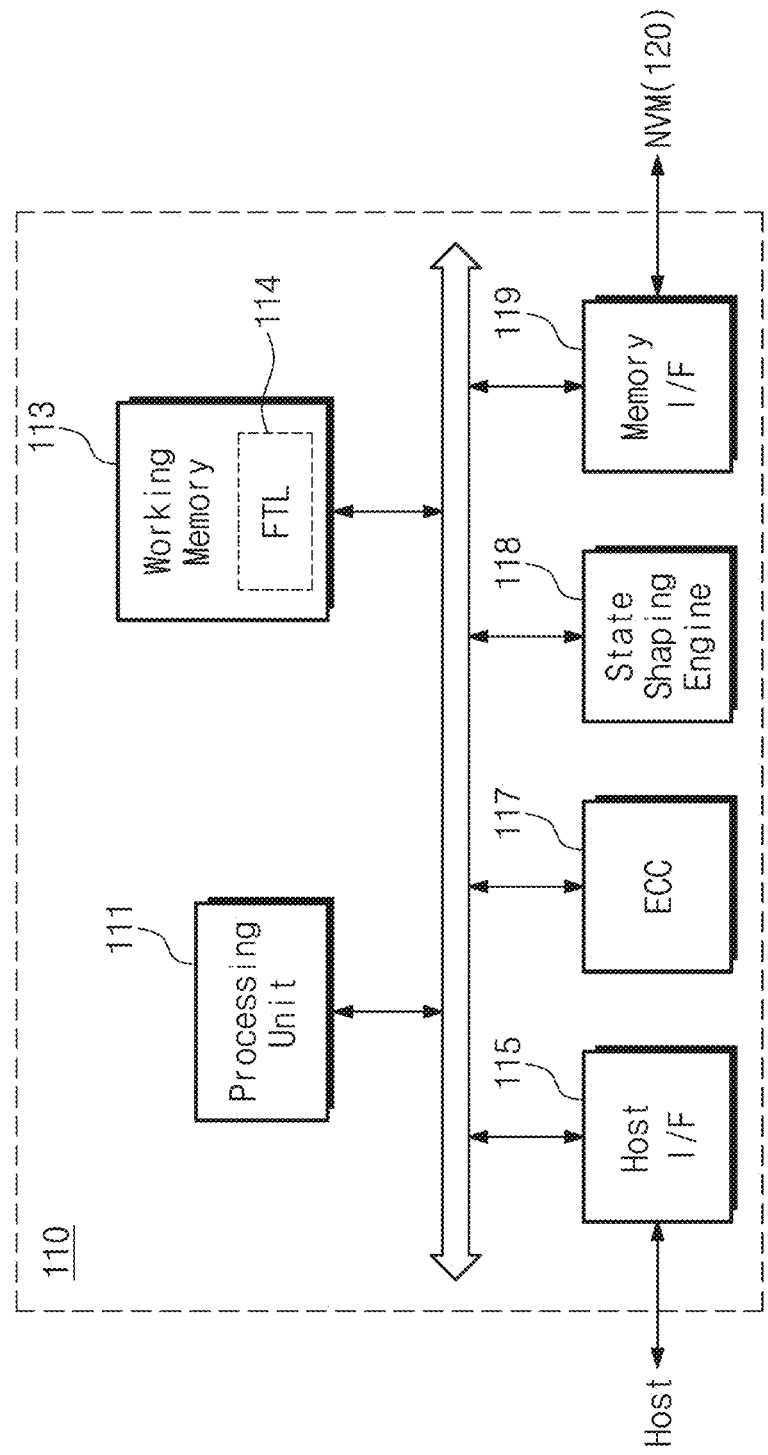
FIG. 3 is a block diagram illustrating a configuration of a storage controller of FIG. 1.

FIG. 3 is a block diagram illustrating a configuration of the storage controller 110 of FIG. 1. Referring to FIG. 3, the storage controller 110 of the inventive concepts includes a processing unit 111, a working memory 113, a host interface 115, an error correction code block 117, the state shaping engine 118, and a memory interface 119. However, it may be well understood that components of the storage controller 110 are not limited to the above components. For example, the storage controller 110 may further include a read only memory (ROM) that stores code data for an initial booting operation.

The processing unit 111 may include a central processing unit (CPU) or a microprocessor. The processing unit 111 may manage overall operations of the storage controller 110. The processing unit 111 is configured to drive firmware for driving the storage controller 110.

Software (or firmware) for controlling the storage controller 110 or data may be loaded onto the working memory 113. The stored software and data may be driven or processed by the processing unit 111. For example, according to an example embodiment of the inventive concepts, a flash translation layer 114 performing functions such as address managing, wear leveling, and garbage collection may be loaded onto the working memory 113.

The host interface 115 provides an interface between the host and the storage controller 110. The host and the storage controller 110 may be connected through one of various standardized interfaces. Here, the standardized interfaces include various interfaces such as an advanced technology attachment (ATA) interface, a serial ATA (SATA) interface, an external SATA (e-SATA) interface, a small computer small interface (SCSI), a serial attached SCSI (SAS), a peripheral component interconnection (PCI) interface, a PCI Express (PCI-E) interface, a universal serial bus (USB) interface, an IEEE 1394 interface, a universal flash storage (UFS) interface, and a card interface.

The error correction code block 117 may correct an error of data damaged due to various causes. For example, the error correction code block 117 may perform an operation for detecting or correcting an error of data read from the nonvolatile memory device 120. For example, the error correction code block 117 may detect the number of error bits or a bit error rate BER of data read from memory cells in units of a word line, depending on a request of the flash translation layer 114. In the case of applying the state shaping technology of the inventive concepts, the state shaping may be applied to each of word lines, and thus reliability of data may be improved. Accordingly, the bit error rate BER of data written in memory blocks may be improved.

The state shaping engine 118 encodes write data received from the host and provides the encoded data to the nonvolatile memory device 120. For example, the state shaping engine 118 may perform encoding such that the state shaping is differentiated for each area of the nonvolatile memory device 120. The state shaping engine 118 may encode the write data based on weak or vulnerable characteristics according to locations of word lines of the nonvolatile memory device 120. In the case where the encoded write data are programmed to the nonvolatile memory device 120, a threshold voltage distribution having the optimum reliability may be formed for each word line. Here, it may be well understood that a unit by which a write data pattern is shaped is not limited to a word line.

The memory interface 119 provides an interface between the storage controller 110 and the nonvolatile memory device 120. For example, data processed by the processing unit 111 are stored in the nonvolatile memory device 120 through the memory interface 119. For another example, data stored in the nonvolatile memory device 120 are provided to the processing unit 111 through the memory interface 119.

The components of the storage controller 110 are described above. According to the function of the state shaping engine 118 included in the storage controller 110 of the inventive concepts, it may be possible to differently perform the state shaping on a word line or block basis. Accordingly, the state shaping may be possible in consideration of weakness or vulnerability appearing for each memory area, and thus reliability of program data may be improved.

Figure 4:
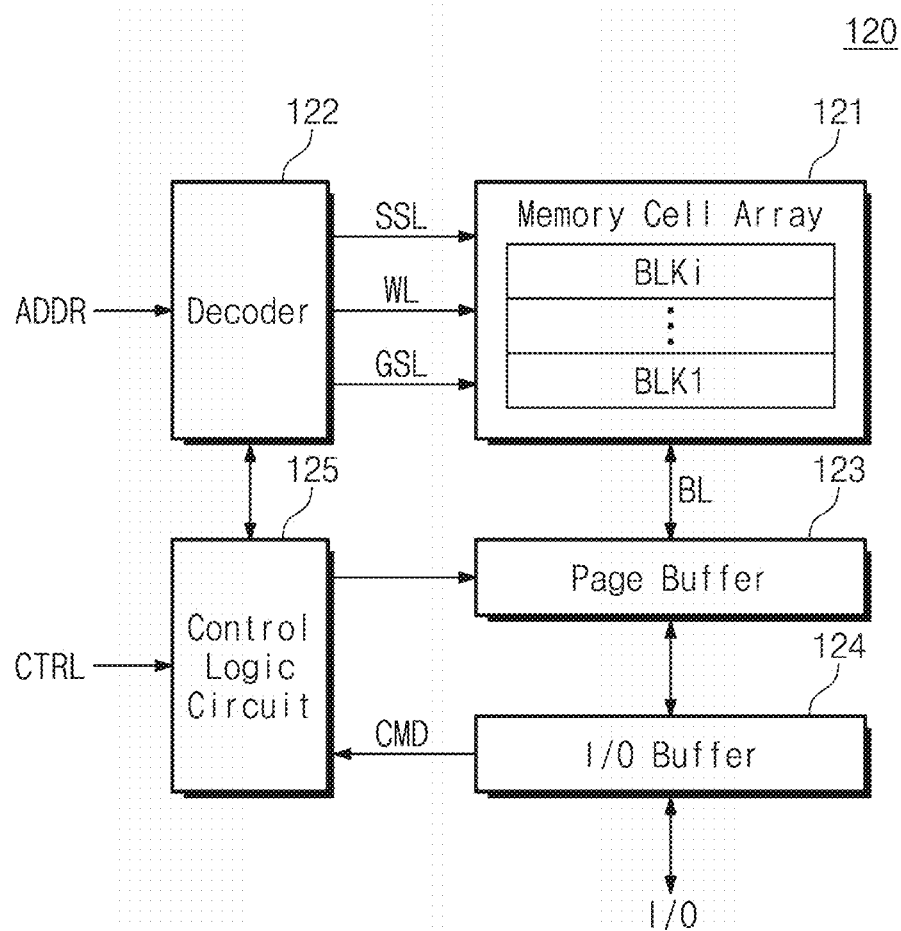
FIG. 4 is a block diagram illustrating a nonvolatile memory device according to an example embodiment of the inventive concepts.

FIG. 4 is a block diagram illustrating a nonvolatile memory device according to an example embodiment of the inventive concepts. Referring to FIG. 4, the nonvolatile memory device 120 includes a cell array 121, a decoder 122, a page buffer 123, an input/output buffer 124, and a control logic circuit 125.

The cell array 121 is connected with the decoder 122 through word lines WL and selection lines SSL and GSL. The cell array 121 is connected with the page buffer 123 through bit lines BL. The cell array 121 includes the plurality of memory cells BLK1 to BLKi. Each of the memory blocks BLK1 to BLKi includes a plurality of NAND cell strings. Data may be written to the cell array 121 on a page basis. An erase operation may be performed on a memory block basis According to an example embodiment of the inventive concepts, the cell array 121 may be implemented with a three-dimensional (3D) memory array. The 3-dimensional memory array may be monolithically formed in one or more physical levels of a memory cell array having an active area, which is arranged on a silicon substrate and a circuit related to an operation of memory cells.

In an example embodiment of the inventive concepts, the 3D memory array includes vertical NAND strings that are vertically oriented such that at least one memory cell is located over another memory cell. The at least one memory cell includes a charge trap layer. Each vertical NAND string may include at least one selection transistor located over memory cells. At least one selection transistor may have the same structure as those of memory cells and may be monolithically formed together with memory cells.

The decoder 122 may select one of the memory blocks BLK1 to BLKi of the cell array 121 in response to an address ADD. The decoder 122 may provide a word line voltage corresponding to an operating mode to a word line of a selected memory block. The decoder 122 may provide a selection signal to the selection lines SSL and GSL to select a memory block. In the read operation, a read voltage Vrd may be applied to a selected word line of a memory block and may provide a pass read voltage Vread to unselected words.

The page buffer 123 may operate as a write driver or a sense amplifier based on an operating mode. In a program operation, the page buffer 123 supplies, to a bit line of the cell array 121, a bit line voltage corresponding to data to be programmed. In the read operation, the page buffer 123 senses data stored in a selected memory cell through a bit line. The page buffer 123 latches the sensed data and outputs the latched data to the external.

The input/output buffer 124 provides write data received in the program operation to the page buffer 123. The input/output buffer 124 outputs data provided from the page buffer 123 to the outside in the read operation. The input/ output buffer 124 may provide the received address or the received command to the control logic circuit 125 or the decoder 122.

The control logic circuit 125 controls the decoder 122 and the page buffer 123 in response to a command CMD or a control signal CTRL. The control logic circuit 125 may control the decoder 122 to generate biases in various different schemes depending on a program command. For example, the control logic circuit 125 may output information about a program result depending on a request from the storage controller 110.

The number of word lines stacked in each of the memory blocks BLK1 to BLKi increases to implement a high-capacity memory device. Also, the number of bits of data to be stored in each of the memory cells increases. For example, in one memory block, the weakness of memory cells may vary depending on relative locations from a substrate. For example, memory cells close to the substrate have a characteristic weak or vulnerable to the read disturbance. In contrast, a charge leakage characteristic appears at memory cells belonging to the middle area between the substrate and a bit line.

As described above, the state shaping capable of forming an optimum distribution may be differently applied depending on locations of memory cells. That is, in the case of memory cells belonging to a lower area in a memory block, the state shaping may be applied in such a way that the number of memory cells of the erase state "E" decreases. In the case of memory cells belonging to a middle area in the memory block, the state shaping may be applied in such a way that the number of memory cells of the uppermost state P15 (in case of a QLC) decreases. In the case where the state shaping is performed as described above, the reduction of reliability due to a weak characteristic such as read disturbance or charge leakage may decrease.

Figure 5:
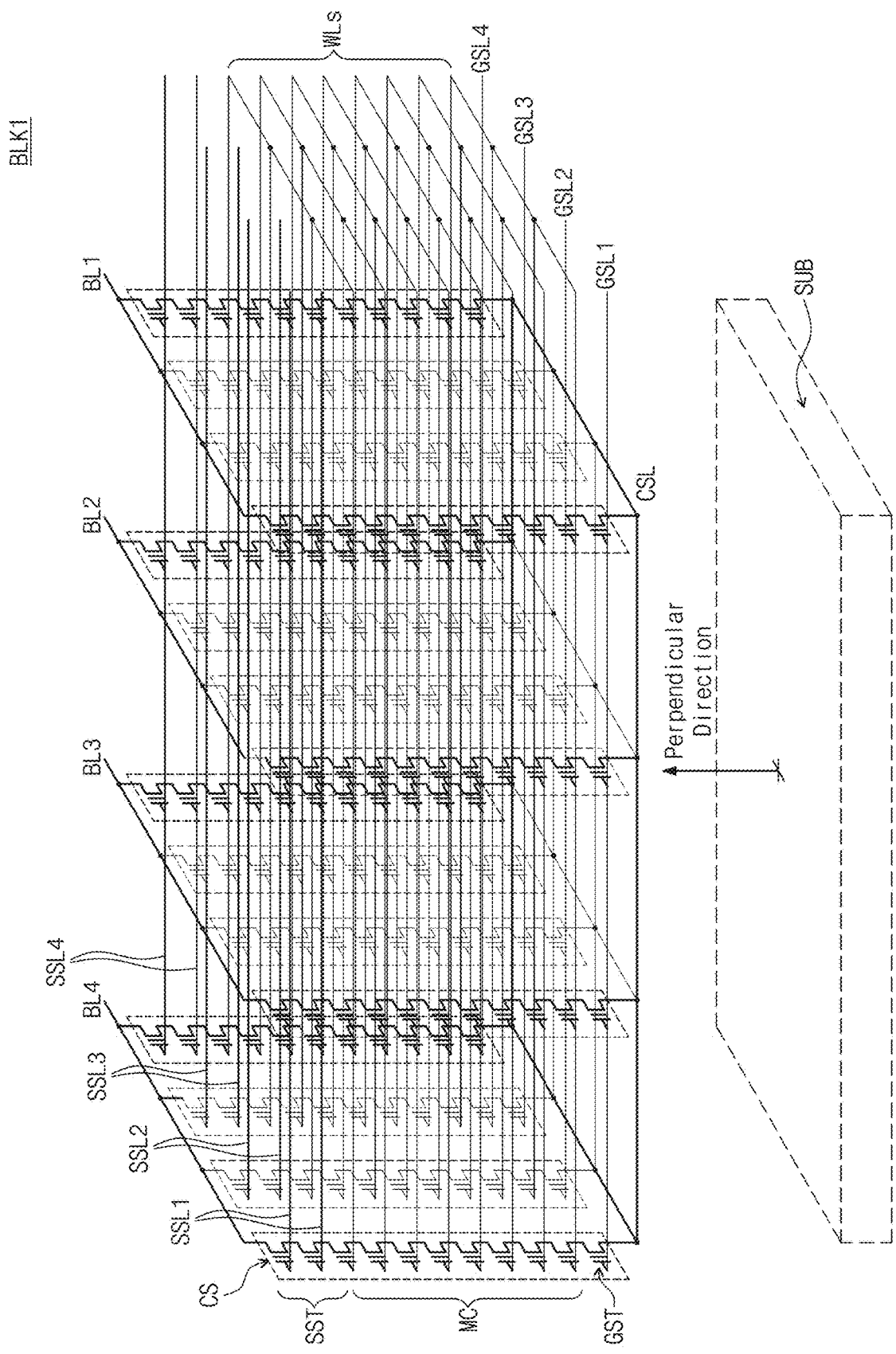
FIG. 5 illustrates a circuit diagram of a memory block.

FIG. 5 illustrates a circuit diagram of a memory block BLK1. Referring to FIG. 5, cell strings CS are formed between bit lines BL1, BL2, BL3, and BL4 and a common source line CSL.

Cell strings CS are formed between the bit line BL1 and the common source line CSL. In the same manner, a plurality of cell strings CS are formed between the bit lines BL2, BL3, and BL4 and the common source line CSL. In each cell string CS, a string selection transistor SST is connected with a corresponding bit line BL. The string selection transistors SST of the cell strings CS may be controlled by string selection lines SSL (e.g., SSL1, SSL2, SSL3, and SSL4). In each cell string CS, a ground selection transistor GST is connected with the common source line CSL. In each cell string CS, memory cells are provided between the string selection transistor SST and the ground selection transistor GST.

Each cell string CS includes the ground selection transistor GST. The ground selection transistors GST of the cell strings CS may be controlled by ground selection lines GSL (e.g., GSL1, GSL2, GSL3, and GSL4). In some example embodiments, although not illustrated in drawing, cell strings may be controlled by different ground selection lines for respective rows.

One layer may be modeled as one word line. A plurality of memory cells MC are connected with one word line. In the memory block of the three-dimensional structure described above, characteristics of memory cells may vary depending on relative distances from a substrate SUB. For example, memory cells connected with a word line belonging to the lower area (or close to the substrate SUB) may have a characteristic weak or vulnerable to the read disturbance. In contrast, a charge leakage characteristic appears relatively greatly at memory cells connected with word lines belonging to the middle area between the substrate SUB and the bit lines BL1 to BL4.

To compensate for the characteristics for respective locations described above, the state shaping may be applied to the memory cells placed in the lower area of the memory cell such that the number of memory cells of the erase state "E" decreases. Further, the state shaping may be applied to the memory cells placed in the middle area of the memory cell such that the number of memory cells of the uppermost state P15 (in case of a QLC) decreases.

A circuit structure of memory cells included in one memory block is briefly described above. However, the circuit structure illustrated in FIG. 5 is only a structure simplified for convenience of description, and an actual memory block is not limited to the example illustrated in FIG. 5. That is, it may be well understood that one memory block is capable of including more semiconductor layers, more bit lines, and more string selection lines.

Figure 6:
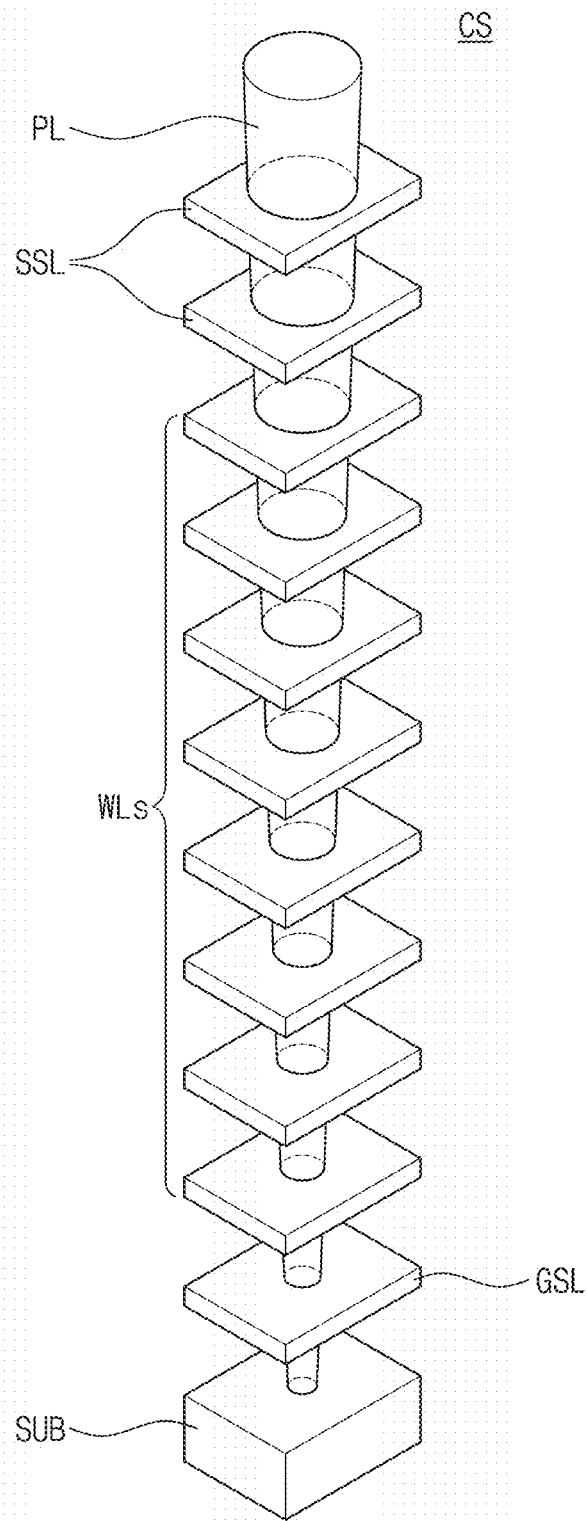
FIG. 6 is a diagram illustrating a structure of one cell string CS included in a memory block of FIG. 5.

FIG. 6 is a diagram illustrating a structure of one cell string CS included in a memory block of FIG. 5. Referring to FIG. 6, there is provided a pillar PL that extends in a direction perpendicular to the substrate SUB and is in contact with the substrate SUB.

Here, a ground selection line GSL, word lines WL, and string selection lines SSL may be formed of conductive materials parallel to the substrate SUB, for example, metal materials. The pillar PL may be in contact with the substrate SUB through the conductive materials that form the string selection lines SSL, the word lines WL, and the ground selection line GSL. Also, the word lines WL may include a dummy word line (not specifically denoted in FIG. 6) connected with a dummy memory cell that is not used to store data. The dummy word line may be used for various purposes.

In the process of manufacturing the cell string CS, the shorter a distance from the substrate SUB, the smaller a width of the pillar PL or a cross-sectional area parallel to the upper surface of the substrate SUB. Accordingly, when the same voltage is applied to bodies of the ground selection transistor GST, the memory cells MC, and the string selection transistors SST and the same voltage is applied to the ground selection line GSL, the word lines WL, and the string selection lines SSL, an electric field formed at a memory cell or the ground selection transistor GST that is adjacent to the substrate SUB is greater than an electric field formed at a memory cell or the string selection transistor SST that is distant from the substrate SUB. The above characteristic has an influence on program disturbance that occurs while a program operation is performed.

To solve an issue according to a geometric characteristic of the cell string CS described above, there may be applied the state shaping of the inventive concepts, which varies depending on a location of a selected word line.

Figure 7:
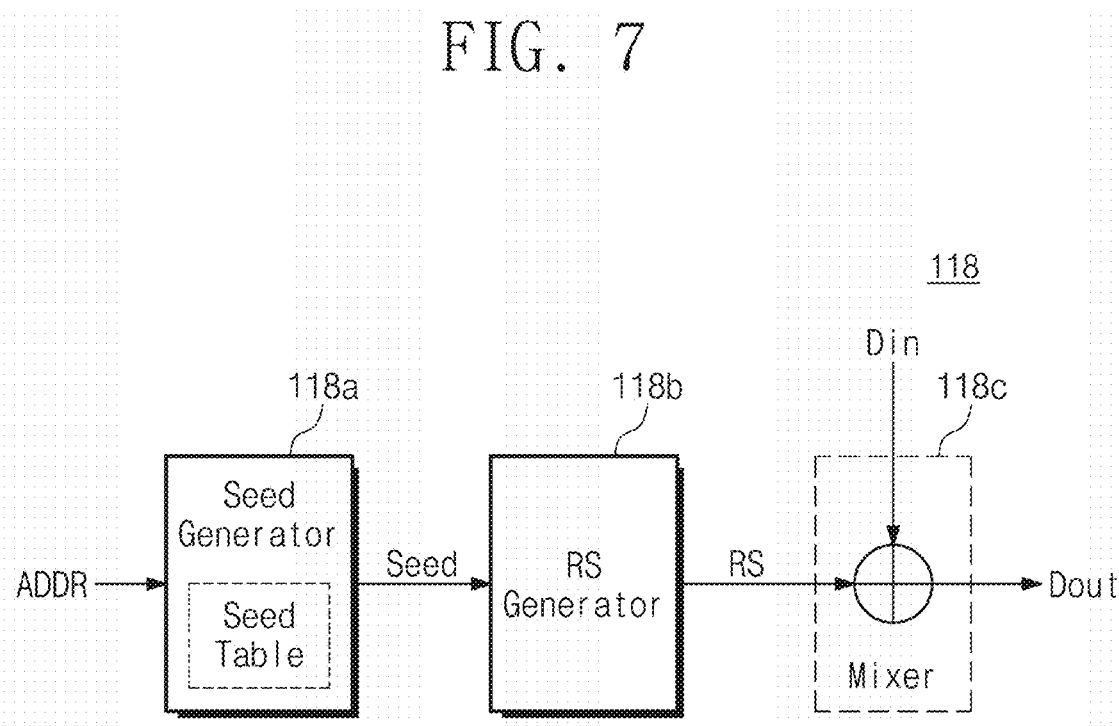
FIG. 7 is a block diagram illustrating an example configuration of a state shaping engine of FIG. 3.

FIG. 7 is a block diagram illustrating an example configuration of the state shaping engine 118 of FIG. 3. Referring to FIG. 7, the state shaping engine 118 may include a seed generator 118a, a random sequence generator 118b, and a mixer 118c.

A threshold voltage distribution that memory cells form after a program operation may be adjusted depending on a seed that is used in a randomization operation of data to be programmed. For example, in a program operation of a quadruple level cell (QLC) having one of 16 threshold voltage states, the number of memory cells included in a specific state may decrease or increase depending on a seed value that is used in a randomization operation. The state shaping is a technology for generating or selecting a seed that is used in the randomization operation for increasing or decreasing the number of memory cells included in a specific state.

The seed generator 118a generates a seed corresponding to a specific area unit with reference to the received address ADDR. Here, the specific area may correspond to a page unit, a word line unit, a grouped word line unit, or an area unit of the nonvolatile memory device 120 such as a memory block or a plane. That is, the seed generator 118a generates a seed capable of being allocated in units of a specific area. For example, the seed generator 118a may be implemented in the form of a lookup table such that different seeds are selected depending on locations of word lines of the nonvolatile memory device 120. In this case, the seed generator 118a may obtain a seed for each word line from the lookup table with reference to the address ADDR. When a seed corresponding to one word line is selected, the seed generator 118a provides the generated seed to the random sequence generator 118b.

The random sequence generator 118b generates the random sequence RS by using the seed provided from the seed generator 118a. The random sequence generator 118b generates the random sequence RS by using the input seed as a source. For example, the random sequence generator 118b may be implemented with a linear feedback shift register (LSFR) operating in a Fibonacci configuration.

The random sequence RS generated by the random sequence generator 118b for the randomization operation is mixed with input data Din by the mixer 118c. For example, output data Dout may be generated by performing an XOR operation on respective bits of the random sequence RS and respective bits of the input data Din. Here, the input data Din may be a plurality of page data to be stored in memory cells connected with one word line. The randomized data Dout generated by the mixer 118c may be provided to the page buffer 123 of the nonvolatile memory device 120 so as to be programmed in a selected area.

Figure 8A:
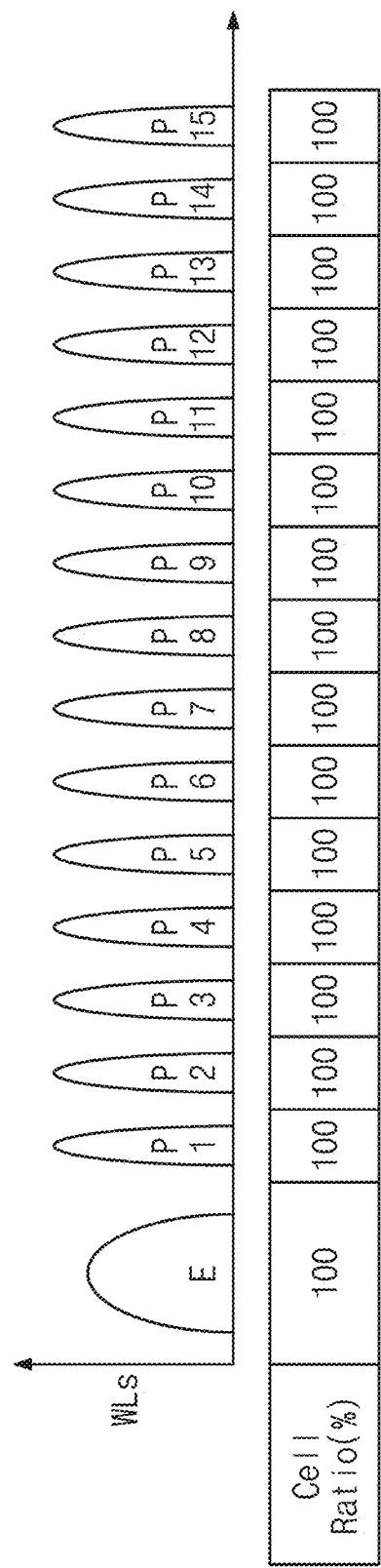
FIGS. 8A to 8C are diagrams illustrating a result of a state shaping operation according to seed selection of the inventive concepts.
Figure 8B:
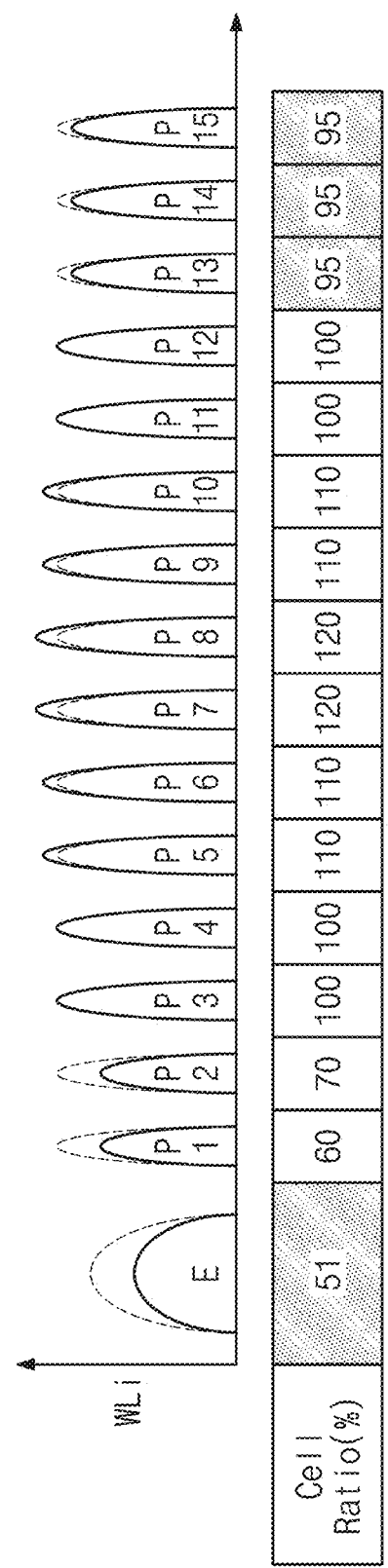
Figure 8C:
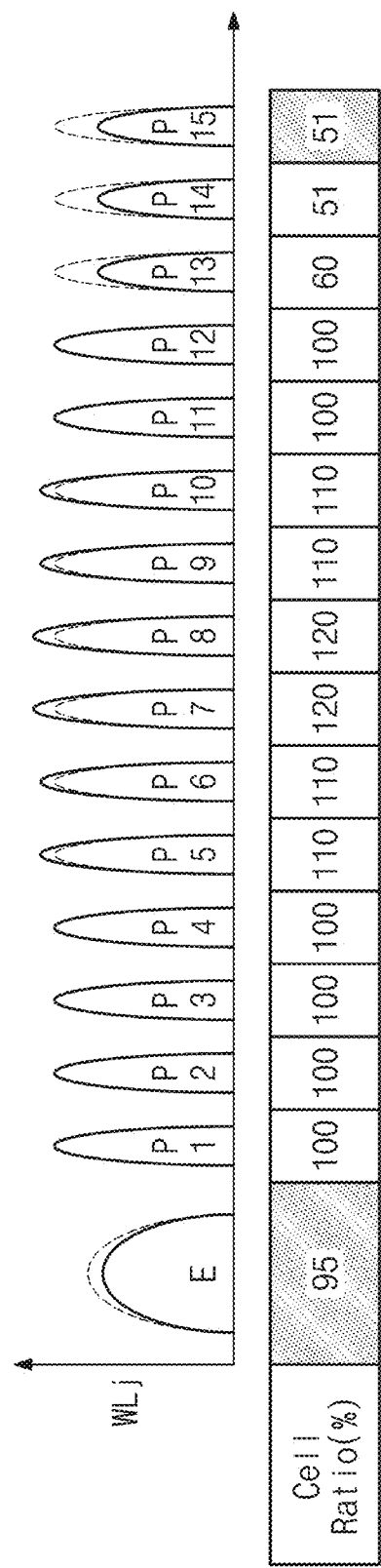

FIGS. 8A to 8C are diagrams illustrating a result of a state shaping operation according to seed selection of the inventive concepts. FIG. 8A is a diagram illustrating a result of state shaping in which an equal number of memory cells are allocated to each state, FIGS. 8B and 8C are diagrams illustrating the case where state shaping is differently applied for each word line. Features of the inventive concepts will be described under the assumption that each of memory cells of the nonvolatile memory device 120 is a quadruple level cell (QLC) having one of 16 threshold voltage states.

An example of equal shaping in which an equal number of memory cells are allocated to each of states "E" to P15 in a program operation is illustrated in FIG. 8A.

In the case where the equal shaping is applied, memory cells of a selected area allocated to the states "E" to P15 are equal or substantially similar in number. Here, a cell ratio may indicate a ratio of the number of memory cells included in a corresponding state to a basic value. Here, the basic value may indicate the number of memory cells included respective states in the case where an equal number of memory cells are allocated to each state. That is, the case where the cell ratio is 100% may be understood as the equal shaping in which the state shaping is not applied to a corresponding state. That is, in the case where the equal shaping is applied, an equal number of memory cells may be included in each program state when the program operation is completed.

The state shaping according to an example embodiment of the inventive concepts, which are associated with memory cells connected with a word line WLi, is illustrated in FIG. 8B. A first seed SED1 for the state shaping illustrated in FIG. 8B may be used in the randomization operation for programming the memory cells connected with the word line WLi. For example, the cell ratio of the erase state "E" may be 51%. This means that the number of memory cells having the erase state "E" after the program operation from among the memory cells connected with the word line WLi is decreased as much as 49% compared to the case where the equal shaping is applied.

In addition, the cell ratio of each of the program states P13, P14, and P15 corresponding to relatively high threshold voltage distributions is 95%. This means that the number of memory cells programmed to each of the program states P13, P14, and P15 is decreased as much as 5% compared to the case where the equal shaping is applied.

Likewise, the cell ratio of the program state P1 is 60%. This means that the number of memory cells programmed to the program state P1 from among the memory cells connected with the word line WLi is decreased as much as 40% compared to the case where the equal shaping is applied.

In contrast, the cell ratio of each of the program states P5, P6, P9, and P10 is 110%. This means that the number of memory cells having each of the program states P5, P6, P9, and P10 after the program operation from among the memory cells connected with the word line WLi is increased as much as 10% compared to the case where the equal shaping is applied. Also, the cell ratio of each of the program states P7 and P8 is 120%. This means that the number of memory cells having each of the program states P7 and P8 after the program operation from among the memory cells connected with the word line WLi is increased as much as 20% compared to the case where the equal shaping is applied. In addition, the cell ratio of each of the program states P3, P4, P11, and P12 is 100%. This means that the number of memory cells having each of the program states P3, P4, P11, and P12 after the program operation is equal to that in the case where the equal shaping is applied.

The state shaping according to an example embodiment of the inventive concepts, which are associated with memory cells connected with a word line WLj, is illustrated in FIG. 8C. A second seed SED2 different from the first seed SED1 may be used in the randomization operation for programming the memory cells connected with the word line WLj. In this case, the cell ratio of the erase state "E" may be 95%. This means that the number of memory cells having the erase state "E" after the program operation from among the memory cells connected with the word line WLj is decreased as much as 5% compared to the case where the equal shaping is applied.

In addition, the cell ratio of each of the program states P14 and P15 corresponding to relatively high threshold voltage distributions is 51%. This means that the number of memory cells programmed to each of the program states P14 and P15 is decreased as much as 49% compared to the case where the equal shaping is applied. The cell ratio of the program state P13 is 60%. This means that the number of memory cells programmed to the program state P14 is decreased as much as 40% compared to the case where the equal shaping is applied.

The cell ratio of each of the program states P7 and P8 is 120%. This means that the number of memory cells having each of the program states P7 and P8 after the program operation from among the memory cells connected with the word line WLj is increased as much as 20% compared to the case where the equal shaping is applied. The cell ratio of each of the program states P5, P6, P9, and P10 is 110%. This means that the number of memory cells having each of the program states P5, P6, P9, and P10 after the program operation from among the memory cells connected with the word line WLj is increased as much as 10% compared to the case where the equal shaping is applied.

The cell ratio of each of the program states P1, P2, P3, P4, P11, and P12 is 100%. This means that the number of memory cells having each of the program states P1, P2, P3, P4, P11, and P12 after the program operation is equal to that in the case where the equal shaping is applied.

Examples of the state shaping according to an example embodiment of the inventive concepts are briefly described above. According to the state shaping of the memory cells connected with the word line WLi, the number of memory cells included in the erase state "E" is deceased. The reduction of characteristic due to the read disturbance may decrease as the number of memory cells of the erase state "E" decreases. In a three-dimensional nonvolatile memory device, the reduction of characteristic due to the read disturbance appears at memory cells corresponding to word lines placed close to a substrate. Accordingly, the word line WLi may be a lower word line close to the substrate.

In contrast, according to the state shaping of the memory cells connected with the word line WLj, the number of memory cells included in each of the upper program states P13, P14, and P15 in which a threshold voltage is relatively high is deceased. A drop of a threshold voltage due to the charge leakage appears greater at memory cells of the upper program states P13, P14, and P15 after the memory cells are programmed. Accordingly, the reduction of reliability due to the charge leakage may decrease by reducing the number of memory cells of the upper program states P13, P14, and P15. For example, the reduction of reliability (or retention) due to the charge leakage appears greater at memory cells connected with word lines of the middle area in the three-dimensional nonvolatile memory device. Accordingly, the word line WLj may be a middle word line between the substrate and a bit line.

How the read disturbance characteristic may be reduced and/or the reduction of the retention characteristic may be mitigated or prevented through the word line-based state shaping is described above. However, characteristics according to a location of each word line is not limited to the characteristics described above. It may be well understood that a seed SED for applying a variety of state shaping is capable of being applied to word lines from which the reduction of characteristic is variously detected.

FIG. 9 is a diagram illustrating a seed table according to an example embodiment of the inventive concepts. Referring to FIG. 9, the seed generator 118a (refer to FIG. 7) may include seeds SED1 to SED92 respectively allocated to word lines. Each of the seeds SED1 to SED92 may determine a state shape of memory cells connected with the corresponding word line. Here, as a number "k" of a word line WLk becomes smaller, a word line may become closer to a substrate.

The seed SED1 may be allocated to a word line WL1. In the case of randomizing data to be programmed by using a random sequence generated through the seed SED1, the number of memory cells included in the lower states "E", P1, P2, and P3 is decreased. In the case where the seed SED1 is allocated to the word line WL1, each of the erase state "E" and the program states P1, P2, and P3 may be formed at the cell ratio of 50%. Each of the program states P4 to P12 may be formed at the cell ratio of 110%, the program state P13 may be formed at the cell ratio of 90%, and each of the upper program states P14 and P15 may be formed at the cell ratio of 95%.

Likewise, in the case where the seed SED2 is allocated to a word line WL2, the erase state "E" may be formed at the cell ratio of 52%, and each of the program states P1, P2, and P3 may be formed at the cell ratio of 73%. Each of the program states P4 to P12 may be formed at the cell ratio of 110%, and each of the upper program states P13 to P15 may be formed at the cell ratio of 95%. As the seed SED3 is allocated to a word line WL3, the erase state "E" may be formed at the cell ratio of 53%, and each of the program states P1, P2, and P3 may be formed at the cell ratio of 73%. Each of the program states P4 to P12 may be formed at the cell ratio of 105%, each of the program states P13 and P14 may be formed at the cell ratio of 98%, and the program state P15 may be formed at the cell ratio of 95%. As the seed SED4 is allocated to a word line WL4, the erase state "E" may be formed at the cell ratio of 53%, and each of the program states P1, P2, and P3 may be formed at the cell ratio of 73%. Each of the program states P4 to P12 may be formed at the cell ratio of 105%, each of the program states P13 and P14 may be formed at the cell ratio of 98%, and the program state P15 may be formed at the cell ratio of 96%.

The word lines WL1 to WL4 correspond to lower word lines close to the substrate (or correspond to word lines belonging to the lower area of a memory block). Accordingly, memory cells connected with the word lines WL1 to WL4 have a characteristic weak or vulnerable to the read disturbance. In the case of programming data based on seeds corresponding to word lines as described above, the number of memory cells included in the erase state "E" may decrease. The reduction of characteristic due to the read disturbance may decrease as the number of memory cells of the erase state "E" decreases.

The seed SED44 may be allocated to a word line WL44. In the case of randomizing data to be programmed by using a random sequence generated through the seed SED44, the number of memory cells included in the uppermost program state P15 is decreased. That is, in the case where the seed SED44 is allocated to the word line WL44, the uppermost program state P15 may be formed at the cell ratio of 50%, the program state P14 below the uppermost program state P15 may be formed at the cell ratio of 60%, and the program state P13 may be formed at the cell ratio of 70%. As the seed SED44 is applied to the word line WL44, each of the erase state "E" and the program states P1, P2, and P3 may be formed at the cell ratio of 95%, and each of the program states P4 to P12 may be formed at the cell ratio of 110%.

In the case where the seed SED45 is allocated to a word line WL45, the uppermost program state P15 may be formed at the cell ratio of 51%, the program state P14 below the uppermost program state P15 may be formed at the cell ratio of 61%, and the program state P13 may be formed at the cell ratio of 71%. As the seed SED45 is applied to the word line WL45, each of the erase state "E" and the program states P1, P2, and P3 may be formed at the cell ratio of 95%, and each of the program states P4 to P12 may be formed at the cell ratio of 110%.

In the case where the seed SED46 is allocated to a word line WL46, the uppermost program state P15 may be formed at the cell ratio of 51%, the program state P14 below the uppermost program state P15 may be formed at the cell ratio of 60%, and the program state P13 may be formed at the cell ratio of 70%. As the seed SED46 is applied to the word line WL46, each of the erase state "E" and the program states P1, P2, and P3 may be formed at the cell ratio of 96%, and each of the program states P4 to P12 may be formed at the cell ratio of 110%.

In the case where the seed SED47 is allocated to a word line WL47, the uppermost program state P15 may be formed at the cell ratio of 50%, the program state P14 below the uppermost program state P15 may be formed at the cell ratio of 62%, and the program state P13 may be formed at the cell ratio of 69%. As the seed SED47 is applied to the word line WL47, each of the erase state "E" and the program states P1, P2, and P3 may be formed at the cell ratio of 96%, and each of the program states P4 to P12 may be formed at the cell ratio of 105%.

The word lines WL44 to WL47 correspond to word lines belonging to the middle area from among word lines WL1 to WL92 formed between the substrate and a bit line. Accordingly, a charge leakage characteristic of memory cells connected with the word lines WL44 to WL47 is relatively great. In the case of programming memory cells connected with a word line of the middle area, the reduction of reliability due to the charge leakage may decrease by reducing the number of memory cells to be programmed to upper program states (e.g., the program states P14 and P15).

The seeds SED89 to SED92 may be respectively allocated to the word lines WL89 to WL92. In the case of randomizing data to be programmed by using a random sequence generated through each of the seeds SED89 to SED92, each of the erase state "E" and the program states P1, P2, and P3 may be formed at the cell ratio of 99%, and each of the program states P4 to P12 may be formed at the cell ratio of 105%. Each of the upper program states P13, P14, and P15 may be formed at the cell ratio of 98%.

It may be possible to cope with the reduction of characteristic of memory cells occurring depending on a location of a word line, by allocating a seed to a selected word line based on the seed table described above. That is, with regard to memory cells connected with word lines of the lower area close to the substrate, the reduction of characteristic due to the read disturbance may decrease by reducing the number of memory cells of the erase state "E". In addition, in the case of programming memory cells connected with a word line of the middle area between the substrate and a bit line, the reduction of reliability due to the charge leakage may decrease by reducing the number of memory cells to be programmed to upper program states (e.g., P14 and P15).

FIG. 10 is a diagram illustrating a seed table according to another example embodiment of the inventive concepts. Referring to FIG. 10, the seed generator 118a (refer to FIG. 7) may include seeds SED_a to SED_c respectively allocated to word line groups. The seed generator 118a may store and manage the seeds SED_a to SED_c in the form of a seed table. Each of the seeds SED_a to SED_c may determine a state shape of memory cells belonging to the corresponding word line group.

The first seed SED_a may be allocated to a first word line group WL1 to WL9. In the case of randomizing data to be programmed by using a random sequence generated through the first seed SED_a, the erase state "E" may be formed at the cell ratio of 50%. In addition, each of the program states P1, P2, and P3 corresponding to a relatively low threshold voltage may be formed at the cell ratio of 70%. Each of the program states P4 to P12 may be formed at the cell ratio of 110%, and each of the upper program states P13, P14, and P15 may be formed at the cell ratio of 90% or 95%.

In a three-dimensional structure in which a cell string is formed to be perpendicular to a substrate, memory cells of the first word line group WL1 to WL9 placed at a lower portion of a memory block have a characteristic weak or vulnerable the read disturbance. When the first seed SED_a is applied in the case of programming memory cells of the first word line group WL1 to WL9, the number of memory cells included in the erase state "E" or lower program states (e.g., P1 to P3) may be decreased. For example, the reduction of characteristic due to the read disturbance may decrease as the number of memory cells of the erase state "E" decreases.

The second seed SED_b may be allocated to a second word line group WL10 to WL78. In the case of randomizing data to be programmed by using a random sequence generated through the second seed SED_b, the erase state "E" may be formed at the cell ratio of 95%, and each of the program states P1, P2, and P3 may be formed at the cell ratio of 96%. Each of the program states P4 to P12 may be formed at the cell ratio of 110%, the program state P13 may be formed at the cell ratio of 71%, the program state P14 may be formed at the cell ratio of 61%, and the program state P15 may be formed at the cell ratio of 51%.

In the three-dimensional structure in which a cell string is formed to be perpendicular to the substrate, a charge leakage characteristic of memory cells of the second word line group WL10 to WL78 placed at a middle portion of the memory block is relatively great. In the case of programming memory cells connected with a word line belonging to the middle portion, the reduction of reliability due to the charge leakage may decrease by reducing the number of memory cells to be programmed to upper program states (e.g., P13, P14, and P15).

The third seed SED_c may be allocated to a third word line group WL79 to WL92. In the case of randomizing data to be programmed by using a random sequence generated through the third seed SED_c, each of the erase state "E" and the lower program states P1, P2, and P3 may be formed at the cell ratio of 99%. Each of the program states P4 to P12 may be formed at the cell ratio of 105%, and each of the upper program states P13, P14, and P15 may be formed at the cell ratio of 98%. The cell ratios of the states formed by using the third seed SED_c may be relatively uniform compared to those formed by using the first seed SED_a and the second seed SED_b. The reason is that the memory cells included in the third word line group WL79 to WL92 are relatively less exposed or vulnerable to the read disturbance or the charge leakage characteristic compared to the first and second word line groups.

An example of a seed table in which the seeds SED_a to SED_c are applied in units of a word line group is briefly described above. However, a range of a word line group and values of the cell ratios of respective states described above are only an example. It may be well understood that a range of a word line group and values of the cell ratios of respective states are changed depending on various purposes.

Figure 11A:
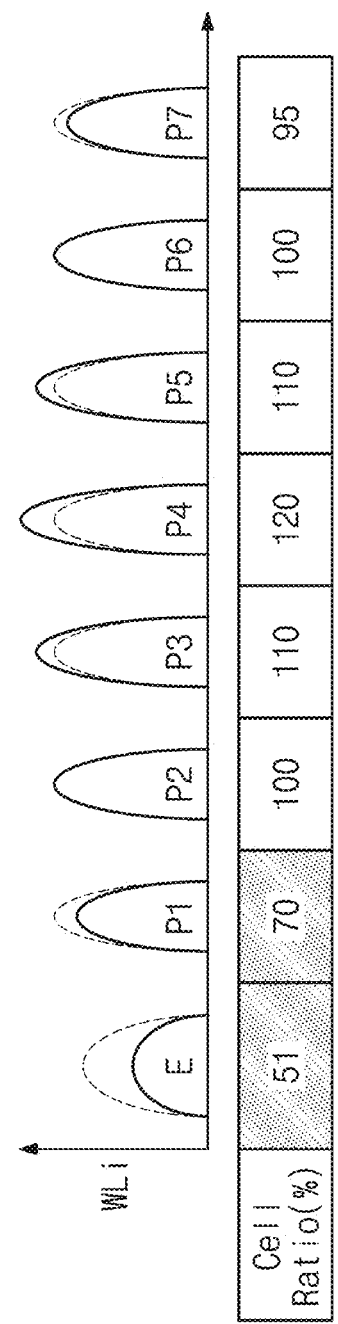
FIGS. 11A and 11B are diagrams illustrating another example of a state shaping operation according to seed selection of the inventive concepts.
Figure 11B:
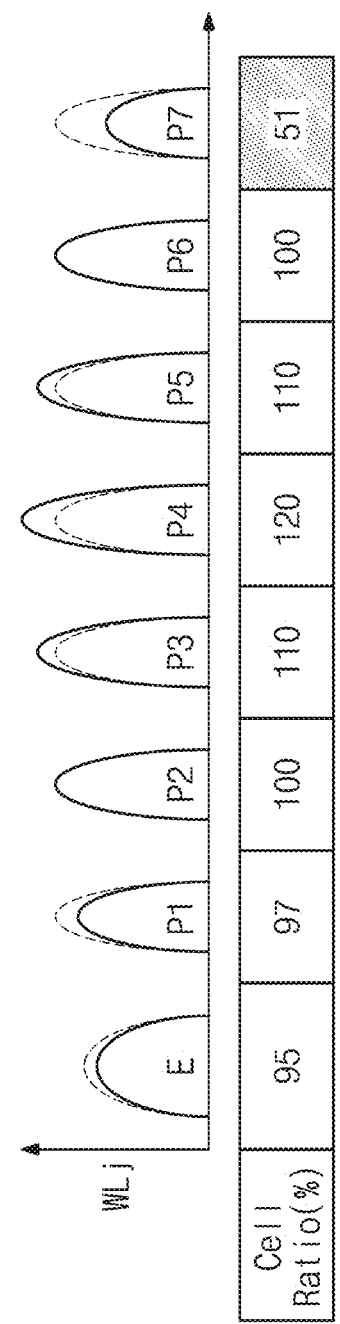

FIGS. 11A and 11B are diagrams illustrating another example of a state shaping operation according to seed selection of the inventive concepts. FIG. 11A is a diagram illustrating state shaping associated with word lines (hereinafter referred to as "lower word lines") placed in a lower area of a memory block, and FIG. 11B is a diagram illustrating state shaping associated with word lines (hereinafter referred to as "middle word lines") placed in a middle area of the memory block. Features of the inventive concepts will be described under the assumption that each of memory cells of the nonvolatile memory device 120 (refer to FIG. 1) is a triple level cell (TLC) having one of 8 threshold voltage states.

The state shaping associated with memory cells connected with lower word lines WLi is illustrated in FIG. 11A. A seed for the state shaping illustrated in FIG. 11A may be used in the randomization operation for programming the memory cells connected with the word line WLi. In this case, the cell ratio of the erase state "E" may be 51%. This means that the number of memory cells having the erase state "E" after the program operation from among memory cells connected with the word line WLi is decreased compared to the case where the equal shaping is applied. In addition, the cell ratio of the program state P1 is 70%. Each of the program states P2 and P6 may be formed at the cell ratio of 100%, each of the program states P3 and P5 may be formed at the cell ratio of 110%, the program state P4 may be formed at the cell ratio of 120%, and the uppermost program state P7 may be formed at the cell ratio of 95%.

The word line WLi may be a lower word line close to the substrate. Memory cells connected with the word line WLi placed at the lower portion of the memory block have a characteristic weak or vulnerable to the read disturbance. In the case of programming data based on the seed corresponding to lower word lines as described above, the number of memory cells included in the erase state "E" may decrease. The reduction of characteristic due to the read disturbance may decrease as the number of memory cells of the erase state "E" decreases.

The state shaping associated with memory cells connected with middle word lines WLj is illustrated in FIG. 11B. A seed for the state shaping illustrated in FIG. 11B may be used in the randomization operation for programming the memory cells connected with the word line WLj. In this case, the cell ratio of the erase state "E" may be 95%. In addition, the cell ratio of the program state P1 is 97%. Each of the program states P2 and P6 may be formed at the cell ratio of 100%, each of the program states P3 and P5 may be formed at the cell ratio of 110%, the program state P4 may be formed at the cell ratio of 120%, and the uppermost program state P7 may be formed at the cell ratio of 51%.

A seed different from the seed applied to the word line WLi illustrated in FIG. 11A may be applied in the randomization operation for programming memory cells connected with the word line WLj. In this case, the cell ratio of the erase state "E" may be 95%, and the cell ratio of the uppermost program state P7 is 51%. This means that the number of memory cells to be programmed to the uppermost program state P7 is relatively decreased.

According to the state shaping of the memory cells connected with the word line WLj, the number of memory cells included in the uppermost program state P7 in which a threshold voltage is relatively high is deceased. A drop of a threshold voltage due to the charge leakage appears greater at memory cells of the uppermost program state P7 after the memory cells are programmed. Accordingly, the reduction of reliability due to the charge leakage may decrease by reducing the number of memory cells of the uppermost program state P7.

State shaping results of memory cells corresponding to the two word lines WLi and WLj placed at the lower portion and the middle portion are described as an example. According to the state shaping of the memory cells connected with the word line WLi, the number of memory cells included in the erase state "E" is deceased. The reduction of characteristic due to the read disturbance may decrease as the number of memory cells of the erase state "E" decreases. In contrast, according to the state shaping of the memory cells connected with the word line WLj, the number of memory cells included in the uppermost program state P7 in which a threshold voltage is relatively high is deceased. A drop of a threshold voltage due to the charge leakage appears at memory cells of the uppermost program state P7 after the memory cells are programmed. Accordingly, the reduction of reliability due to the charge leakage may decrease by reducing the number of memory cells of the uppermost program state P7.

How the read disturbance characteristic is reduced and how the retention characteristic is mitigated or prevented through the word line-based state shaping is described above. However, the reduction of characteristic according to a location of each word line is not limited to the characteristics described above. It may be well understood that a seed SED for applying a variety of state shaping is capable of being applied to word lines from which the reduction of characteristic is variously detected.

FIGS. 12A and 12B are diagrams illustrating seed tables according to another example embodiment of the inventive concepts. FIG. 12A illustrates a seed table for performing the state shaping on a memory block basis, and FIG. 12B illustrates a seed table for performing the state shaping on a memory plane basis.

Referring to FIG. 12A, the seed generator 118a (refer to FIG. 7) may include seeds SED_i to SED_1 that are allocated on a memory block or memory block group basis. The seed generator 118a may store and manage the seeds SED_i to SED_1 in the form of a seed table. Each of the seeds SED_i to SED_1 may determine a state shape of memory cells connected with a selected word line.

The first seed SED_i may be allocated to a first block group BLK0 to BLK2999. In the case of randomizing data to be programmed by using a random sequence generated through the first seed SED_i, the erase state "E" may be formed at the cell ratio of 50%. In addition, each of the program states P1, P2, and P3 corresponding to a relatively low threshold voltage may be formed at the cell ratio of 70%. Each of the program states P4 to P12 may be formed at the cell ratio of 110%, and each of the upper program states P13, P14, and P15 may be formed at the cell ratio of 90% or 95%.

The second seed SED_j may be allocated to a second block group BLK3000 to BLK3399. In the case of randomizing data to be programmed by using a random sequence generated through the second seed SED_j, the erase state "E" may be formed at the cell ratio of 95%, and each of the program states P1, P2, and P3 may be formed at the cell ratio of 96%. Each of the program states P4 to P12 may be formed at the cell ratio of 110%, the program state P13 may be formed at the cell ratio of 71%, the program state P14 may be formed at the cell ratio of 61%, and the program state P15 may be formed at the cell ratio of 51%.

The third seed SED_k may be allocated to a third block group BLK3400 to BLK3799. In the case of randomizing data to be programmed by using a random sequence generated through the third seed SED_k, each of the erase state "E" and the lower program states P1, P2, and P3 may be formed at the cell ratio of 99%. Each of the program states P4 to P12 may be formed at the cell ratio of 105%, and each of the upper program states P13, P14, and P15 may be formed at the cell ratio of 98%.

The fourth seed SED_1 may be allocated to a fourth block group BLK3800 to BLK6799. In the case of randomizing data to be programmed by using a random sequence generated through the fourth seed SED_1, the erase state "E" may be formed at the cell ratio of 95%, and each of the program states P1, P2, and P3 may be formed at the cell ratio of 97%. Each of the program states P4 to P12 may be formed at the cell ratio of 105%, the program state P13 may be formed at the cell ratio of 97%, and each of the upper program states P14 and P15 may be formed at the cell ratio of 95%.

An example of a seed table in which the seeds SED_i to SED_1 are applied in units of a block is briefly described above. However, a range of memory blocks and values of the cell ratios of respective states described above are only an example. It may be well understood that a range of a memory block group and values of the cell ratios of respective states are changed depending on various purposes.

Referring to FIG. 12B, the seed generator 118a (refer to FIG. 7) may include the seeds SED_i to SED_1 that are allocated on a plane basis. The seed generator 118a may store and manage the seeds SED_i to SED_1 in the form of a seed table. Each of the seeds SED_i to SED_1 may determine a state shape of memory cells connected with a selected word line.

The first seed SED_i may be allocated to a first plane group including Plane1 to Plane5. In the case of randomizing data to be programmed by using a random sequence generated through the first seed SED_i, the erase state "E" may be formed at the cell ratio of 50%. In addition, each of the program states P1, P2, and P3 corresponding to a relatively low threshold voltage may be formed at the cell ratio of 70%. Each of the program states P4 to P12 may be formed at the cell ratio of 110%, and each of the upper program states P13, P14, and P15 may be formed at the cell ratio of 90% or 95%.

The second seed SED_j may be allocated to a second plane group including Plane6 to Plane10. In the case of randomizing data to be programmed by using a random sequence generated through the second seed SED_j, the erase state "E" may be formed at the cell ratio of 95%, and each of the program states P1, P2, and P3 may be formed at the cell ratio of 96%. Each of the program states P4 to P12 may be formed at the cell ratio of 110%, the program state P13 may be formed at the cell ratio of 71%, the program state P14 may be formed at the cell ratio of 61%, and the program state P15 may be formed at the cell ratio of 51%.

The third seed SED_k may be allocated to a third plane group including Plane11 to Plane15. In the case of randomizing data to be programmed by using a random sequence generated through the third seed SED_k, each of the erase state "E" and the lower program states P1, P2, and P3 may be formed at the cell ratio of 99%. Each of the program states P4 to P12 may be formed at the cell ratio of 105%, and each of the upper program states P13, P14, and P15 may be formed at the cell ratio of 98%.

The fourth seed SED_1 may be allocated to a fourth plane group including Plane16 to Plane20. In the case of randomizing data to be programmed by using a random sequence generated through the fourth seed SED_1, the erase state "E" may be formed at the cell ratio of 95%, and each of the program states P1, P2, and P3 may be formed at the cell ratio of 97%. Each of the program states P4 to P12 may be formed at the cell ratio of 105%, the program state P13 may be formed at the cell ratio of 97%, and each of the upper program states P14 and P15 may be formed at the cell ratio of 95%.

An example of a seed table in which the seeds SED_i to SED_1 are applied in units of a plane of a nonvolatile memory device is briefly described above. However, a range of planes and values of the cell ratios of respective states described above are only example. It may be well understood that a range of a plane group and values of the cell ratios of respective states are changed depending on various purposes. In addition, an example in which a seed is allocated on a block or plane basis is described, but it may be well understood that it is possible to allocate a seed for improvement reliability based on various memory area units.

Figure 13:
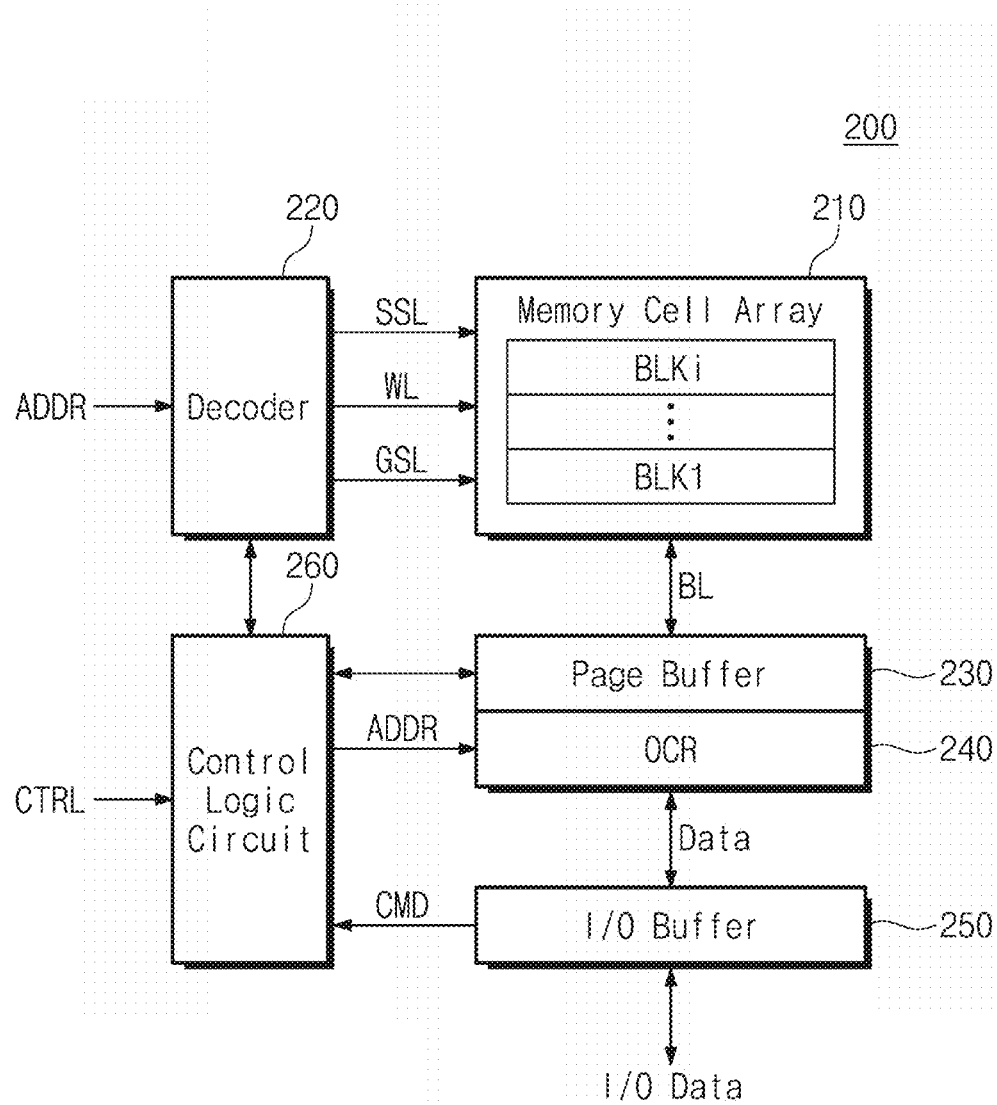
FIG. 13 is a block diagram of a nonvolatile memory device, which performs an on-chip randomization operation, according to another example embodiment of the inventive concepts.

FIG. 13 is a block diagram of a nonvolatile memory device, which performs an on-chip randomization operation, according to another example embodiment of the inventive concepts. Referring to FIG. 13, a nonvolatile memory device 200 includes a cell array 210, a decoder 220, a page buffer 230, an on-chip randomizer 240, an input/output buffer 250, and a control logic circuit 260.

The cell array 210 is connected with the decoder 220 through the word lines WL and the selection lines SSL and GSL. The cell array 210 is connected with the page buffer 230 through bit lines BL. The cell array 210 includes a plurality of NAND cell strings.

The decoder 220 may select one of the memory blocks BLK1 to BLKi of the cell array 210 in response to a row address ADDR. The decoder 220 may select one of word lines of a selected memory block. The decoder 220 transfers a word line voltage to the selected word line. The decoder 220 transfers selection signals to selection lines (e.g., SSL or GSL) of the selected memory block. The decoder 220 may transfer a program/verification voltage to a selected word line and a pass voltage to an unselected word line(s).

The page buffer 230 may operate as a write driver or a sense amplifier depending on an operating mode. In a program operation, the page buffer 230 supplies, to a bit line of the cell array 210, a bit line voltage corresponding to data to be programmed. In a read operation, the page buffer 230 senses data stored in a selected memory cell through a bit line. The page buffer 230 may latch the sensed data and may output the latched data to the outside.

The on-chip randomizer 240 is configured to perform the randomization operation on data to be programmed to the cell array 210. The on-chip randomizer 240 may select a seed to be used for the randomization operation with reference to the address ADDR. As the seed is selected, the on-chip randomizer 240 may perform the state shaping on an area basis (e.g., on a word line basis). In addition, the on-chip randomizer 240 may perform a de-randomization operation on data that are sensed from the cell array 210 and are then stored in the page buffer 230. A seed used in the randomization operation may be used in the de-randomization operation.

The on-chip randomizer 240 randomizes data to be programmed and outputs the randomized data to the page buffer 230. For example, the on-chip randomizer 240 may perform encoding for providing a threshold voltage distribution differentiated for each area of the cell array 210. The on-chip randomizer 240 may encode data to be programmed, based on weak characteristics according to locations of word lines of the cell array 210. As the encoded data are programmed to the cell array 210, a threshold voltage distribution having the optimum reliability may be formed for each word line. Here, it may be well understood that a unit by which the on-chip randomizer 240 performs encoding for the state shaping is not limited to a word line unit.

The on-chip randomizer 240 may generate a seed from the address ADDR or may select a seed based on the address ADDR. The on-chip randomizer 240 may generate the random sequence RS with reference to the seed. The on-chip randomizer 240 may randomize data to be stored in a target area by using the generated random sequence RS and may provide the randomized data to the page buffer 230.

The input/output buffer 250 provides write data received in the program operation to the page buffer 230. In the read operation, the input/output buffer 250 outputs data provided from the page buffer 230 to the outside. The input/output buffer 250 provides the received address or command to the control logic circuit 260, the decoder 220, or the on-chip randomizer 240.

The control logic circuit 260 controls the page buffer 230 and the on-chip randomizer 240 in response to the command CMD and the address ADDR from the input/output buffer 250. The control logic circuit 260 performs an operation corresponding to a write command, a read command, or an erase command provided through the input/output buffer 250, with respect to a selected memory area.

According to an example embodiment of the inventive concepts, the nonvolatile memory device 200 includes the on-chip randomizer 240 that performs the state shaping differentiated for each area. For example, the on-chip randomizer 240 may apply a seed for performing the state shaping in units of word lines. For example, memory cells connected with lower word lines close to a substrate have a characteristic weak or vulnerable to the read disturbance. In the case of programming memory cells connected with the lower word lines, the on-chip randomizer 240 may use a seed that allows the number of memory cells of the erase state "E" to decrease. The reduction of characteristic due to the read disturbance may decrease as the number of memory cells of the erase state "E" decreases. Also, in the case of programming memory cells connected with word lines placed in a middle area of a three-dimensional memory block, the on-chip randomizer 240 may perform the randomization operation such that the number of memory cells to be programmed to upper program states decreases, thus making the reduction of reliability due to the charge leakage small.

Figure 14:
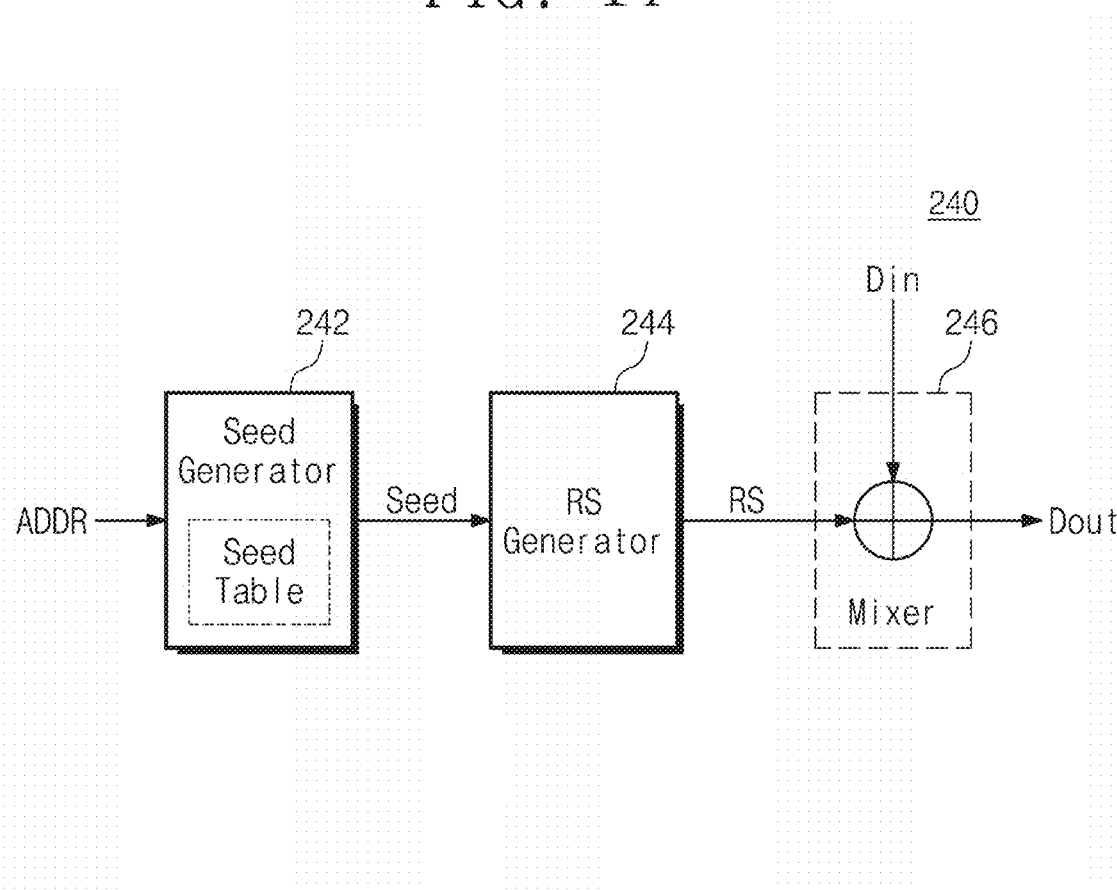
FIG. 14 is a block diagram illustrating an exemplary configuration of an on-chip randomizer illustrated in FIG. 13.

FIG. 14 is a block diagram illustrating an example configuration of an on-chip randomizer illustrated in FIG. 13. Referring to FIG. 14, the on-chip randomizer 240 may include a seed generator 242, a random sequence generator 244, and a mixer 246.

The seed generator 242 generates a seed corresponding to a specific area unit with reference to the received address ADDR. Here, the specific area may correspond to a page unit, a word line unit, a word line group unit, or an area unit of the cell array 210 such as a memory block or a plane. That is, the seed generator 242 generates a seed capable of being allocated in units of a specific area. For example, the seed generator 242 may be implemented in the form of a lookup table such that different seeds are selected depending on locations of word lines. In this case, the seed generator 242 may obtain a seed for each word line from the lookup table with reference to the target address ADDR. When a seed corresponding to one word line is selected, the seed generator 242 provides the generated seed to the random sequence generator 244.

The random sequence generator 244 generates the random sequence RS by using the seed provided from the seed generator 242. The random sequence generator 244 generates the random sequence RS by using the input seed as a source. For example, the random sequence generator 244 may be implemented with a linear feedback shift register (LSFR) operating in the Fibonacci configuration.

The random sequence RS generated by the random sequence generator 244 for the randomization operation is mixed with the input data Din by the mixer 246. For example, the output data Dout may be generated by performing an XOR operation on respective bits of the random sequence RS and respective bits of the input data Din. Here, the input data Din may be one or more page data provided from the input/output buffer 250.

The random sequence RS generated by the random sequence generator 244 for the randomization operation is mixed with the input data Din by the mixer 246. For example, the output data Dout may be generated by performing an XOR operation on respective bits of the random sequence RS and respective bits of the input data Din. Here, the input data Din may be a plurality of page data to be stored in memory cells connected with one word line. The randomized data Dout generated by the mixer 246 may be provided to the page buffer 230 so as to be programmed in a selected area.

Figure 15:
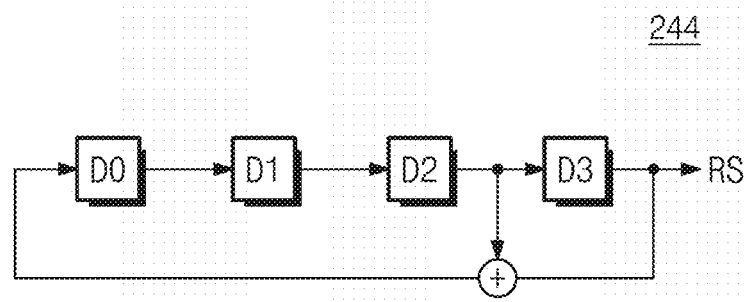
FIG. 15 is a diagram illustrating an example of a random sequence generator of FIG. 14.

FIG. 15 is a diagram illustrating an example of a random sequence generator of FIG. 14. The random sequence generator 244 that is implemented with four flip-flops to generate a random sequence in the Fibonacci configuration is illustrated in FIG. 15. A generation polynomial g(X) for the random sequence generator 244 is expressed by Equation 1 below.

$$g(X) = X^4 + X + 1 \quad \text{[Equation 1]}$$

That is, the random sequence generator 244 may be implemented with the linear feedback shift register (LSFR) including a plurality of flip-flops. Here, binary values that are respectively stored in flip-flops D0, D1, D2, and D3 correspond to a seed. A stream of bits that are output as a clock is toggled may be the random sequence RS.

It is assumed that an initial value of the flip-flops D0, D1, D2, and D3 of the random sequence generator 244 is [1 0 0 0]. After 15 clock cycles, a value of the flip-flops D0, D1, D2, and D3 is set to be equal to the initial value. When a clock cycle "T" is 15, data states of the flip-flops D0, D1, D2, and D3 may be set to the initial value. A stream of bits that are output from the flip-flop D3 may be provided as a random sequence. The random sequence generator 244 illustrated in FIG. 15 is only an example for generating a random sequence in the Fibonacci configuration. It may be well understood that various types of random sequence generators are able to be provided.

According to an example embodiment of the inventive concepts, issues (e.g., the reduction of reliability) due to the read disturbance or the charge leakage occurring as a nonvolatile memory device is highly integrated may be solved.

Figure 16:
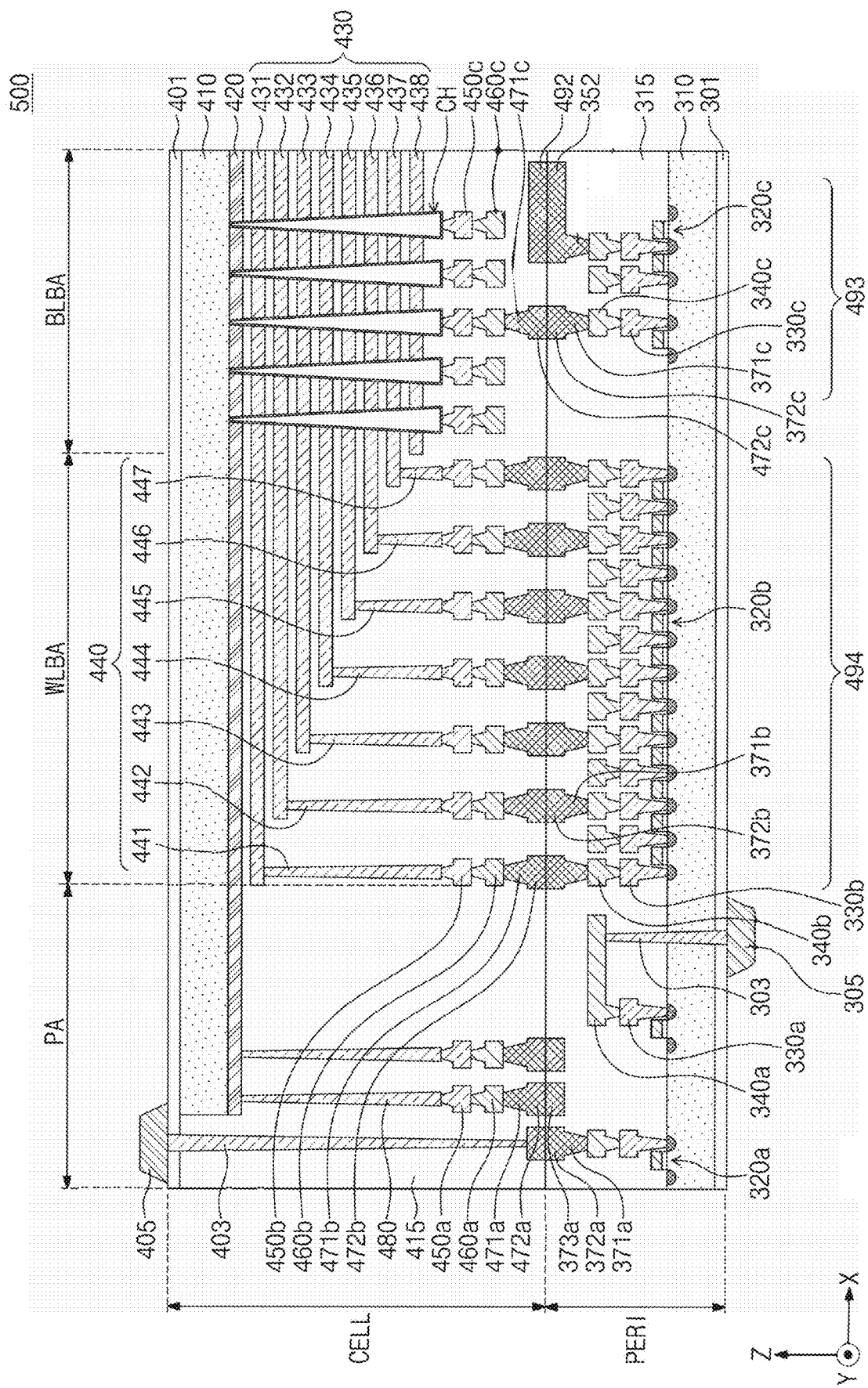
FIG. 16 is a diagram illustrating a cross-sectional view of an example nonvolatile memory device according to an example embodiment.

FIG. 16 is a diagram illustrating a cross-sectional view of an example nonvolatile memory device according to an example embodiment. Referring to FIG. 16, a memory device 500 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 500 may include an external pad bonding area PA, a word line bonding area WLBA, and a bit line bonding area BLBA.

The peripheral circuit region PERI may include a first substrate 310, an interlayer insulating layer 315, a plurality of circuit elements 320a, 320b, and 320c formed on the first substrate 310, first metal layers 330a, 330b, and 330c respectively connected to the plurality of circuit elements 320a, 320b, and 320c, and second metal layers 340a, 340b, and 340c formed on the first metal layers 330a, 330b, and 330c. In an example embodiment, the first metal layers 330a, 330b, and 330c may be formed of tungsten having relatively high resistance, and the second metal layers 340a, 340b, and 340c may be formed of copper having relatively low resistance.

In an example embodiment illustrate in FIG. 16, although the first metal layers 330a, 330b, and 330c and the second metal layers 340a, 340b, and 340c are shown and described, they are not limited thereto, and one or more metal layers may be further formed on the second metal layers 340a, 340b, and 340c. At least a portion of the one or more metal layers formed on the second metal layers 340a, 340b, and 340c may be formed of aluminum or the like having a lower resistance than those of copper forming the second metal layers 340a, 340b, and 340c.

The interlayer insulating layer 315 may be disposed on the first substrate 310 and cover the plurality of circuit elements 320a, 320b, and 320c, the first metal layers 330a, 330b, and 330c, and the second metal layers 340a, 340b, and 340c. The interlayer insulating layer 315 may include an insulating material such as silicon oxide, silicon nitride, or the like.

Lower bonding metals 371b and 372b may be formed on the second metal layer 340b in the word line bonding area WLBA. In the word line bonding area WLBA, the lower bonding metals 371b and 372b in the peripheral circuit region PERI may be electrically connected to upper bonding metals 471b and 472b in the cell region CELL in a bonding manner, and the lower bonding metals 371b and 372b and the upper bonding metals 471b and 472b may be formed of aluminum, copper, tungsten, or the like.

Further, the upper bonding metals 471b and 472b in the cell region CELL may be referred as first metal pads and the lower bonding metals 371b and 372b in the peripheral circuit region PERI may be referred as second metal pads. Further, the first metal pads and the second metal pads may be connected with each other in the bonding manner.

The cell region CELL may include at least one memory block. The cell region CELL may include a second substrate 410 and a common source line 420. On the second substrate 410, a plurality of word lines 431 to 438 (i.e., 430) may be stacked in a direction (a Z-axis direction), perpendicular to an upper surface of the second substrate 410. At least one string select line and at least one ground select line may be arranged on and below the plurality of word lines 430, respectively, and the plurality of word lines 430 may be disposed between the at least one string select line and the at least one ground select line.

In the bit line bonding area BLBA, a channel structure CH may extend in a direction, perpendicular to the upper surface of the second substrate 410, and pass through the plurality of word lines 430, the at least one string select line, and the at least one ground select line. The channel structure CH may include a data storage layer, a channel layer, a buried insulating layer, and the like, and the channel layer may be electrically connected to a first metal layer 450c and a second metal layer 460c. For example, the first metal layer 450c may be a bit line contact, and the second metal layer 460c may be a bit line. In an example embodiment, the bit line 460c may extend in a first direction (a Y-axis direction), parallel to the upper surface of the second substrate 410.

In an example embodiment illustrated in FIG. 16, an area in which the channel structure CH, the bit line 460c, and the like are disposed may be defined as the bit line bonding area BLBA. In the bit line bonding area BLBA, the bit line 460c may be electrically connected to the circuit elements 320c providing a page buffer 493 in the peripheral circuit region PERI. For example, the bit line 460c may be connected to upper bonding metals 471c and 472c in the cell region CELL, and the upper bonding metals 471c and 472c may be connected to lower bonding metals 371c and 372c connected to the circuit elements 320c of the page buffer 493.

In the word line bonding area WLBA, the plurality of word lines 430 may extend in a second direction (an X-axis direction), parallel to the upper surface of the second substrate 410, and may be connected to a plurality of cell contact plugs 441 to 447 (i.e., 440). The plurality of word lines 430 and the plurality of cell contact plugs 440 may be connected to each other in pads provided by at least a portion of the plurality of word lines 430 extending in different lengths in the second direction. A first metal layer 450b and a second metal layer 460b may be connected to an upper portion of the plurality of cell contact plugs 440 connected to the plurality of word lines 430, sequentially. The plurality of cell contact plugs 440 may be connected to the circuit region PERI by the upper bonding metals 471b and 472b of the cell region CELL and the lower bonding metals 371b and 372b of the peripheral circuit region PERI in the word line bonding area WLBA.

The plurality of cell contact plugs 440 may be electrically connected to the circuit elements 320b providing a row decoder 494 in the peripheral circuit region PERI. In an example embodiment, operating voltages of the circuit elements 320b providing the row decoder 494 may be different than operating voltages of the circuit elements 320c providing the page buffer 493. For example, operating voltages of the circuit elements 320c providing the page buffer 493 may be greater than operating voltages of the circuit elements 320b providing the row decoder 494.

A common source line contact plug 480 may be disposed in the external pad bonding area PA. The common source line contact plug 480 may be formed of a conductive material such as a metal, a metal compound, polysilicon, or the like, and may be electrically connected to the common source line 420. A first metal layer 450a and a second metal layer 460a may be stacked on an upper portion of the common source line contact plug 480, sequentially. For example, an area in which the common source line contact plug 480, the first metal layer 450a, and the second metal layer 460a are disposed may be defined as the external pad bonding area PA.

Input-output pads 305 and 405 may be disposed in the external pad bonding area PA. Referring to FIG. 16, a lower insulating film 301 covering a lower surface of the first substrate 310 may be formed below the first substrate 310, and a first input-output pad 305 may be formed on the lower insulating film 301. The first input-output pad 305 may be connected to at least one of the plurality of circuit elements 320a, 320b, and 320c disposed in the peripheral circuit region PERI through a first input-output contact plug 303, and may be separated from the first substrate 310 by the lower insulating film 301. In addition, a side insulating film may be disposed between the first input-output contact plug 303 and the first substrate 310 to electrically separate the first input-output contact plug 303 and the first substrate 310.

Referring to FIG. 16, an upper insulating film 401 covering the upper surface of the second substrate 410 may be formed on the second substrate 410, and a second input-output pad 405 may be disposed on the upper insulating layer 401. The second input-output pad 405 may be connected to at least one of the plurality of circuit elements 320a, 320b, and 320c disposed in the peripheral circuit region PERI through a second input-output contact plug 403.

According to some example embodiments, the second substrate 410 and the common source line 420 may not be disposed in an area in which the second input-output contact plug 403 is disposed. Also, the second input-output pad 405 may not overlap the word lines 430 in the third direction (the Z-axis direction). Referring to FIG. 16, the second input-output contact plug 403 may be separated from the second substrate 410 in a direction, parallel to the upper surface of the second substrate 410, and may pass through the interlayer insulating layer 415 of the cell region CELL to be connected to the second input-output pad 405 and the lower bonding metals 371a and 372a of the peripheral circuit area PERI.

According to some example embodiments, the first input-output pad 305 and the second input-output pad 405 may be selectively formed. For example, the memory device 500 may include only the first input-output pad 305 disposed on the first substrate 310 or the second input-output pad 405 disposed on the second substrate 410. Alternatively, the memory device 500 may include both the first input-output pad 305 and the second input-output pad 405.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 373a, corresponding to upper bonding metals 471a and 472a formed in an uppermost metal layer of the cell region CELL, and having the same shape as an upper metal pattern 472a of the cell region CELL, in an uppermost metal layer of the peripheral circuit region PERI. In the peripheral circuit region PERI, the lower metal pattern 373a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 371b and 372b may be formed on the second metal layer 340b in the word line bonding area WLBA. In the word line bonding area WLBA, the lower bonding metals 371b and 372b of the peripheral circuit region PERI may be electrically connected to the upper bonding metals 471b and 472b of the cell region CELL by a Cu—Cu bonding.

Further, the bit line bonding area BLBA, an upper metal pattern 492, corresponding to a lower metal pattern 352 formed in the uppermost metal layer of the peripheral circuit region PERI, and having the same shape as the lower metal pattern 352 of the peripheral circuit region PERI, may be formed in an uppermost metal layer of the cell region CELL. A contact may not be formed on the upper metal pattern 492 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

The various blocks, engines, controllers, and/or circuit elements included in black boxes, as described in this disclosure, may be implemented using hardware components and a combination of software components and hardware component. For example, the hardware components may include microcontrollers, memory modules, sensors, amplifiers, band-pass filters, analog to digital converters, and processing devices, or the like. A processing device may be implemented using one or more hardware device(s) configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device(s) may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a processing device may include multiple processors or a processor and a controller. In addition, different processing configurations are possible, such as parallel processors, multi-core processors, distributed processing, or the like.

While the inventive concepts has been described with reference to some example embodiments thereof, it will be apparent to those of ordinary skill in the art that various changes and modifications may be made thereto without departing from the spirit and scope of the inventive concepts as set forth in the following claims.

What is claimed is:

1. A nonvolatile memory device comprising:
    a peripheral circuit region; and
    a memory cell region vertically connected to the peripheral circuit region,
    wherein the nonvolatile memory device is configured to receive a write address and write data from an external device,
    wherein the memory cell region includes first bonding metals and a plurality of memory cells connected to a plurality of word lines,
    wherein the peripheral circuit region includes,
        second bonding metals directly connected to the first bonding metals, respectively,
        an on-chip randomizer configured to generate a seed corresponding to the write address, generate a random sequence by using the seed, and randomize the write data by using the random sequence, and
        a page buffer configured to receive the randomized write data from the on-chip randomizer, and provide voltages for programming the randomized write data to the plurality of memory cells via the first and second bonding metals, and
    wherein the seed is variable depending on a location of a word line corresponding to the write address.

2. The nonvolatile memory device of claim 1, wherein:
    the memory cell region includes a first substrate; and
    the peripheral circuit region includes a second substrate.

3. The nonvolatile memory device of claim 2, wherein the seed is a variable depending on a distance from the word line to the first substrate.

4. The nonvolatile memory device of claim 3, wherein:
    the on-chip randomizer is further configured to generate first and second seeds corresponding to first and second word line, respectively, wherein the first word line is closer to the first substrate than the second word line;
    a first number of memory cells are in an erase state when the plurality of memory cells are programmed with a first randomized write data based on the first seed; and
    a second number, greater than the first number, of memory cells are in the erase state when the plurality of memory cells are programmed with a second randomized write data randomized based on the second seed.

5. The nonvolatile memory device of claim 4, wherein:
    a third number of memory cells are in an uppermost program state when the plurality of memory cells are programmed based on the first seed; and
    a fourth number, less than the third number, of memory cells are in the uppermost program state when the plurality of memory cells are programmed based on the second seed.

6. The nonvolatile memory device of claim 4, wherein the second word line is closer to the second substrate than the first word line.

7. The nonvolatile memory device of claim 1, wherein the seed is set to provide state shaping depending on a location of a memory block or a plane of the nonvolatile memory device.

8. The nonvolatile memory device of claim 1, wherein the first bonding metals are connected to the plurality of memory cells through bit lines.

9. A storage device comprising:
    a nonvolatile memory device including a peripheral circuit region and a memory cell region vertically connected to the peripheral circuit region, the memory cell region including a cell array including a plurality of memory cells; and
    a storage controller configured to receive write data and a write address from a host, and randomize the write data to perform state shaping on memory cells selected from the plurality of memory cells depending on the write address,
    wherein the peripheral circuit region is configured to provide voltages for programming the randomized write data to the selected memory cells of the memory cell region under control of the storage controller, and
    wherein the storage controller is configured to use a seed for the state shaping, and the seed is a variable depending on a location of a word line connected to the selected memory cells.

10. The storage device of claim 9, wherein the storage controller is further configured to:
    generate the seed corresponding to the write address;
    generate a random sequence by using the seed; and
    perform a randomization operation on the write data and the random sequence through an XOR operation.

11. The storage device of claim 9, wherein the storage controller is further configured to include or be associated with a seed table that is configured to store a plurality of seeds to be mapped depending on locations of word lines.

12. The storage device of claim 11, wherein:
the plurality of seeds include a first seed mapped onto a first word line and a second seed mapped onto a second word line farther from a substrate of the memory cell region than the first word line;
a first number of memory cells are in an erase state when the plurality of memory cells are programmed based on the first seed; and
a second number, greater than the first number, of memory cells are in the erase state when the plurality of memory cells are programmed based on the second seed.

13. The storage device of claim 12, wherein:
a third number of memory cells are in an uppermost program state when the plurality of memory cells are programmed based on the first seed; and
a fourth number, less than the third number, of memory cells are in the uppermost program state when the plurality of memory cells are programmed based on the second seed.

14. The storage device of claim 9, wherein the storage controller is configured to include or be associated with a seed table configured to store a plurality of seeds to be mapped depending on locations of memory blocks or planes.

15. The storage device of claim 9, wherein:
the memory cell region further includes first bonding metals;
the peripheral circuit region further includes second bonding metals directly connected to the first bonding metals, respectively; and
the peripheral circuit region is further configured to provide the voltages to the selected memory cells of the memory cell region through the first and second bonding metals.

16. A nonvolatile memory device comprising:
a peripheral circuit region; and
a memory cell region vertically connected to the peripheral circuit region,
wherein the memory cell region includes a cell array including a plurality of memory cells having a plurality of program states,
wherein the peripheral circuit region includes,
 a control logic circuit configured to select memory cells from the plurality of memory cells of the memory cell region in response to a control of an external device,
 an on-chip randomizer configured to randomize write data from the external device based on a control of the control logic circuit, and
 a page buffer configured to program the randomized write data provided from the on-chip randomizer to the selected memory cells based on a control of the control logic circuit, and
wherein the on-chip randomizer is configured to perform state shaping on the write data depending on a location of a word line corresponding to the selected memory cells.

17. The nonvolatile memory device of claim 16, wherein:
the memory cell region further includes first bonding metals;
the peripheral circuit region further includes second bonding metals directly connected to the first bonding metals, respectively; and
the page buffer is further configured to provide voltages for programming the randomized write data to the plurality of memory cells via the first and second bonding metals.

18. The nonvolatile memory device of claim 17, wherein the first bonding metals are connected to the plurality of memory cells through bit lines.

19. The nonvolatile memory device of claim 16, wherein the on-chip randomizer is configured to:
generate a seed corresponding to an address;
generate a random sequence by using the seed; and
perform a randomization operation on the write data and the random sequence through an XOR operation.

20. The nonvolatile memory device of claim 19, wherein:
the memory cell region includes a first substrate;
the peripheral circuit region includes a second substrate; and
the seed is a variable depending on a distance from the word line to the first substrate.

* * * * *